United States Patent
Rezny et al.

(10) Patent No.: US 10,895,883 B2
(45) Date of Patent: Jan. 19, 2021

(54) HVAC CONTROLLER WITH A TEMPERATURE SENSOR MOUNTED ON A FLEX CIRCUIT

(71) Applicant: Ademco Inc., Golden Valley, MN (US)

(72) Inventors: Tomas Rezny, Brno (CZ); Josef Novotny, Kuncina (CZ); Jaromir Cechak, Brno (CZ); Mohammad A. Aljabari, Brooklyn Park, MN (US)

(73) Assignee: Ademco Inc., Golden Valley, MN (US)

( * ) Notice: Subject to any disclaimer, the term of this patent is extended or adjusted under 35 U.S.C. 154(b) by 0 days.

(21) Appl. No.: 15/678,000

(22) Filed: Aug. 15, 2017

(65) Prior Publication Data

US 2018/0059694 A1    Mar. 1, 2018

Related U.S. Application Data

(60) Provisional application No. 62/380,219, filed on Aug. 26, 2016.

(51) Int. Cl.
*F24F 11/30* (2018.01)
*G05D 23/19* (2006.01)
(Continued)

(52) U.S. Cl.
CPC .......... *G05D 23/1928* (2013.01); *F24F 11/30* (2018.01); *F24F 11/89* (2018.01);
(Continued)

(58) Field of Classification Search
CPC ........ G05D 23/1928; F24F 11/50; F24F 11/52
See application file for complete search history.

(56) References Cited

U.S. PATENT DOCUMENTS

| 2,462,162 A | 2/1949 | Christensen et al. |
| 2,854,610 A | 9/1958 | Waters et al. |

(Continued)

FOREIGN PATENT DOCUMENTS

| CA | 658329 A | 2/1963 |
| CA | 772736 A | 11/1967 |

(Continued)

OTHER PUBLICATIONS

The International Search Report for PCT Application Serial No. PCT/US2015/054208, dated Mar. 12, 2015.
(Continued)

*Primary Examiner* — Edward F Landrum
*Assistant Examiner* — Daniel C Comings
(74) *Attorney, Agent, or Firm* — Shumaker & Sieffert, P.A.

(57) ABSTRACT

A Heating, Ventilation, and Air Conditioning (HVAC) controller may include a housing, a display, a printed wiring board, a flextail, and a temperature sensor. The housing may be configured to house the display, the printed wiring board, the flextail, and the temperature sensor. The flextail may extend from, for example, the display or other component of the HVAC controller, along the interior surface of the housing, and connect to a connector on the printed wiring board. The temperature sensor may be mounted on the flextail, and connected to the printed circuit board via the flex tail or other connection. In some cases, the temperature sensor may be positioned on the flextail such that when the flextail is connected to the printed wiring board, the temperature sensor is positioned adjacent a lower part of the housing, where less internal heat generated by the internal electrical components of the HVAC controller will reside.

23 Claims, 15 Drawing Sheets

(51) Int. Cl.
*F24F 11/89* (2018.01)
*H05K 5/00* (2006.01)
*H02G 3/14* (2006.01)
*F24F 11/52* (2018.01)
*H05K 1/18* (2006.01)
*H02G 3/10* (2006.01)

(52) U.S. Cl.
CPC ............ *H05K 5/0017* (2013.01); *F24F 11/52* (2018.01); *G05D 23/19* (2013.01); *H02G 3/10* (2013.01); *H02G 3/14* (2013.01); *H05K 1/189* (2013.01); *H05K 2201/10128* (2013.01); *H05K 2201/10151* (2013.01)

(56) References Cited

U.S. PATENT DOCUMENTS

| | | |
|---|---|---|
| 2,879,363 A | 3/1959 | Mulcher |
| 2,961,625 A | 11/1960 | Sion |
| 2,980,875 A | 4/1961 | Sivacek |
| 3,051,001 A | 8/1962 | Laviana et al. |
| 3,087,134 A | 4/1963 | McOrlly |
| 3,096,935 A | 7/1963 | Gibson |
| 3,147,457 A | 9/1964 | Gill et al. |
| 3,152,851 A | 10/1964 | McLaughlin |
| 3,310,646 A | 3/1967 | Edwards |
| 3,747,045 A | 7/1973 | Stross |
| 3,779,079 A | 12/1973 | Snook |
| 3,793,604 A | 2/1974 | Duggan et al. |
| 3,832,668 A | 8/1974 | Berman |
| 3,868,620 A | 2/1975 | McBride, Jr. et al. |
| 3,999,732 A | 12/1976 | Stephens |
| 4,117,257 A | 9/1978 | Thomas |
| 4,119,936 A | 10/1978 | Laviana et al. |
| 4,150,718 A | 4/1979 | Kolbow et al. |
| 4,214,353 A | 7/1980 | Kalina |
| 4,276,536 A | 6/1981 | Wisnia |
| 4,295,180 A | 10/1981 | Herron et al. |
| 4,317,102 A | 2/1982 | Vranas |
| 4,333,069 A | 6/1982 | Worth et al. |
| 4,347,443 A | 8/1982 | Whitney |
| 4,421,271 A | 12/1983 | Shavit |
| 4,431,134 A | 2/1984 | Hendricks et al. |
| 4,508,399 A * | 4/1985 | Dowling ............ H01R 12/616 439/404 |
| 4,514,787 A | 4/1985 | Kaneko et al. |
| 4,560,973 A | 12/1985 | Grimm et al. |
| 4,587,403 A | 5/1986 | Shapess |
| 4,669,654 A | 6/1987 | Levine et al. |
| 4,685,025 A | 8/1987 | Carlomagno |
| 4,708,558 A | 11/1987 | Musil |
| 4,903,759 A * | 2/1990 | Lapeyrouse ....... G05D 23/1917 165/11.1 |
| 4,990,987 A | 2/1991 | Boucher et al. |
| 4,998,085 A | 3/1991 | Johnson |
| 5,008,775 A | 4/1991 | Schindler et al. |
| 5,024,265 A | 6/1991 | Buchholz et al. |
| 5,107,918 A | 4/1992 | McFarlane et al. |
| 5,149,200 A | 9/1992 | Shiokawa et al. |
| 5,213,417 A | 5/1993 | Yamada et al. |
| 5,239,745 A | 8/1993 | Hofsass |
| 5,271,410 A | 12/1993 | Wolzinger et al. |
| 5,291,063 A | 3/1994 | Adishian |
| 5,317,670 A | 5/1994 | Elia |
| 5,321,382 A | 6/1994 | Mizukoshi et al. |
| 5,367,282 A | 11/1994 | Clem |
| 5,436,609 A | 7/1995 | Chan et al. |
| 5,449,234 A | 9/1995 | Gipp et al. |
| 5,485,954 A * | 1/1996 | Guy ................... G05D 23/1904 236/78 R |
| 5,729,442 A | 3/1998 | Frantz |
| D402,569 S | 12/1998 | Papic et al. |
| 5,918,292 A | 6/1999 | Smith |
| 6,102,749 A | 8/2000 | Lynn et al. |
| 6,107,669 A | 8/2000 | Mokuya et al. |
| 6,134,771 A | 10/2000 | Nakamura et al. |
| 6,147,868 A | 11/2000 | Boutillier et al. |
| 6,169,337 B1 | 1/2001 | Yoshida et al. |
| 6,347,747 B1 | 2/2002 | Nesbitt |
| 6,362,953 B1 | 3/2002 | Ohlwine et al. |
| 6,588,931 B2 | 7/2003 | Betzner et al. |
| 6,760,607 B2 | 7/2004 | Al-All |
| 6,776,817 B2 | 8/2004 | Lentz et al. |
| 6,888,441 B2 | 5/2005 | Carey |
| 7,080,941 B1 | 7/2006 | Benjamin et al. |
| 7,140,551 B2 | 11/2006 | De Pauw et al. |
| 7,159,789 B2 | 1/2007 | Schwendinger et al. |
| 7,161,483 B2 | 1/2007 | Chung |
| 7,193,498 B2 | 3/2007 | Kawamoto et al. |
| 7,222,800 B2 | 5/2007 | Wruck |
| 7,271,338 B1 | 9/2007 | Rohmer |
| 7,344,422 B2 | 3/2008 | Helmreich |
| 7,360,376 B2 | 4/2008 | Juntunen et al. |
| D568,719 S | 5/2008 | Gorin et al. |
| 7,416,332 B2 | 8/2008 | Rountree et al. |
| 7,465,087 B2 | 12/2008 | Gul |
| 7,500,780 B2 | 3/2009 | Miki et al. |
| 7,569,777 B1 | 8/2009 | Gillam |
| 7,617,988 B2 | 11/2009 | Morrow et al. |
| 7,633,743 B2 | 12/2009 | Barton et al. |
| 7,726,581 B2 | 6/2010 | Naujok et al. |
| 7,785,004 B2 | 8/2010 | Kautz et al. |
| 7,832,652 B2 | 11/2010 | Barton et al. |
| 7,904,608 B2 | 3/2011 | Price |
| 7,938,336 B2 | 5/2011 | Rhodes et al. |
| 8,004,135 B2 | 8/2011 | Peterson et al. |
| 8,089,032 B2 | 6/2012 | Beland et al. |
| 8,206,032 B2 | 6/2012 | Wakabayashi |
| 8,262,422 B1 | 9/2012 | Chiang |
| 8,337,081 B1 | 12/2012 | Holmberg et al. |
| 8,358,206 B2 | 1/2013 | Huscher et al. |
| 8,364,319 B2 | 1/2013 | Roosli |
| 8,511,576 B2 | 8/2013 | Warren et al. |
| 8,511,577 B2 | 8/2013 | Warren et al. |
| 8,708,242 B2 | 4/2014 | Connor et al. |
| 8,727,611 B2 | 5/2014 | Huppi et al. |
| 8,752,771 B2 | 6/2014 | Warren et al. |
| 8,802,981 B2 | 8/2014 | Wallaert et al. |
| 9,026,232 B2 | 5/2015 | Fadell et al. |
| 9,046,414 B2 | 6/2015 | Fadell et al. |
| 9,092,039 B2 | 7/2015 | Fadell et al. |
| 9,247,378 B2 | 1/2016 | Bisson et al. |
| 9,282,654 B2 | 3/2016 | Bick et al. |
| 9,419,361 B2 | 8/2016 | Daily et al. |
| 9,423,805 B2 | 8/2016 | Novotny et al. |
| 9,494,332 B2 | 11/2016 | Filson et al. |
| 9,587,848 B2 | 3/2017 | Stefanski et al. |
| 9,606,552 B2 | 3/2017 | Stefanski et al. |
| 9,667,009 B1 | 5/2017 | Read et al. |
| 9,674,409 B2 | 6/2017 | Jones |
| 9,686,880 B1 | 6/2017 | Khoury et al. |
| D794,478 S | 8/2017 | Read et al. |
| 9,735,482 B1 | 8/2017 | Read et al. |
| 9,735,518 B1 | 8/2017 | Read et al. |
| 9,748,708 B2 | 8/2017 | Mostoller et al. |
| 9,768,564 B2 | 9/2017 | Read et al. |
| 9,774,158 B2 | 9/2017 | Barton et al. |
| 9,780,511 B2 | 10/2017 | Janovec et al. |
| 2002/0071475 A1 | 6/2002 | Betzner et al. |
| 2003/0097875 A1 | 5/2003 | Lentz et al. |
| 2003/0165181 A1 | 9/2003 | Gul |
| 2005/0114234 A1 | 5/2005 | Thomas et al. |
| 2005/0194457 A1 | 9/2005 | Dolan |
| 2006/0192022 A1 | 8/2006 | Barton et al. |
| 2006/0232736 A1* | 10/2006 | Ahmed .................... G01C 9/20 349/129 |
| 2008/0219319 A1 | 9/2008 | Buckalew |
| 2009/0144014 A1 | 6/2009 | Aljabari |
| 2010/0084482 A1 | 4/2010 | Kennedy et al. |
| 2012/0247187 A1 | 10/2012 | Herz |
| 2013/0099009 A1 | 4/2013 | Filson et al. |
| 2014/0062659 A1 | 3/2014 | Roosli et al. |
| 2014/0190679 A1 | 7/2014 | Roosli et al. |
| 2014/0226286 A1 | 8/2014 | Novotny et al. |

(56) References Cited

U.S. PATENT DOCUMENTS

| | | |
|---|---|---|
| 2014/0268452 A1 | 9/2014 | Khoury et al. |
| 2014/0268470 A1 | 9/2014 | Sapak et al. |
| 2014/0319236 A1 | 10/2014 | Novotny et al. |
| 2014/0321092 A1 | 10/2014 | Novotny et al. |
| 2015/0035680 A1 | 2/2015 | Li et al. |
| 2015/0096352 A1 | 4/2015 | Peterson et al. |
| 2015/0144705 A1 | 5/2015 | Thiruvengada et al. |
| 2015/0159902 A1 | 6/2015 | Quam et al. |
| 2015/0159903 A1 | 6/2015 | Marak et al. |
| 2015/0163945 A1 | 6/2015 | Barton et al. |
| 2015/0327375 A1 | 11/2015 | Bick et al. |
| 2016/0020590 A1 | 1/2016 | Roosli et al. |
| 2016/0104981 A1 | 4/2016 | Mostoller et al. |
| 2016/0266692 A1* | 9/2016 | Park .................. G06F 3/0412 |
| 2017/0060369 A1 | 3/2017 | Goyal et al. |
| 2017/0134214 A1 | 5/2017 | Sethuraman et al. |
| 2017/0184456 A1 | 6/2017 | Chatterjee |
| 2017/0234560 A1 | 8/2017 | Novotny et al. |
| 2017/0234565 A1 | 8/2017 | Emmons et al. |
| 2017/0234568 A1 | 8/2017 | Read et al. |
| 2017/0234569 A1 | 8/2017 | Emmons et al. |
| 2017/0236766 A1 | 8/2017 | Read et al. |
| 2017/0237246 A1 | 8/2017 | Janovec et al. |

FOREIGN PATENT DOCUMENTS

| | | | |
|---|---|---|---|
| CA | 1249869 A | 2/1989 | |
| CA | 2062076 C | 5/2000 | |
| CN | 101180608 A | 5/2008 | |
| CN | 101726921 A | * 6/2010 | |
| CN | 101676698 B | 11/2012 | |
| CN | 203949733 U | 11/2014 | |
| CN | 2039497433 U | 11/2014 | |
| CN | 204291089 | * 4/2015 | .............. H04M 1/02 |
| CN | 103282754 B | 5/2015 | |
| DE | 2036829 A1 | 1/1972 | |
| DE | 2404758 A1 | 8/1975 | |
| DE | 2321715 C2 | 1/1983 | |
| DE | 3703465 A1 | 8/1988 | |
| DE | 69001779 T2 | 1/1994 | |
| DE | 102012005465 B3 | 5/2013 | |
| DE | 202013101582 U1 | 8/2014 | |
| EP | 0976957 A2 | 2/2000 | |
| EP | 1622224 A1 | 2/2006 | |
| FR | 2935201 A1 | 2/2010 | |
| GB | 1116364 A | 6/1968 | |
| JP | 53009910 A | 1/1978 | |
| JP | 59-086812 A | 5/1984 | |
| JP | 60116154 A | 6/1985 | |
| JP | 61005269 | 1/1986 | |
| JP | 02156125 A | 6/1990 | |
| JP | 03038617 | 2/1991 | |
| JP | 03209704 A | 9/1991 | |
| JP | 05079933 A | 3/1993 | |
| JP | 06036904 A | 2/1994 | |
| JP | 60211321 A | 10/1995 | |
| JP | 08153601 A | 6/1996 | |
| JP | 09306317 A | 11/1997 | |
| JP | H9-298780 A | 11/1997 | |
| JP | H10-23565 A | 1/1998 | |
| JP | 11-126727 A | 5/1999 | |
| JP | 2012013564 A | 1/2012 | |
| JP | 6113691 B2 | 1/2013 | |
| JP | 5234043 B2 | 7/2013 | |
| JP | 5274948 B2 | 8/2013 | |
| JP | 5407492 B2 | 2/2014 | |
| WO | 2014165311 A1 | 10/2014 | |

OTHER PUBLICATIONS

Enviromental Technologies, Inc., "Enviro-Tec ETST4H 2" Square Thermostat Mounting Instructions, 1 pages, downloaded Feb. 21, 2016.

Honeywell, "FocusPro 6000 Series Programmable Digital Thermostat, Installation Instructions," 24 pages, Mar. 2014.

Honeywell, "Heating/Cooling Thermostat and Subbase or Heating or Cooling Thermostat and Wallplate, T8195A,B/Q682 Owner's Manual," 24 pages, Dec. 1994.

Honeywell, "Lyric Installation Guide," 9 pages, downloaded Feb. 20, 2016.

Honeywell, "TB6575/TB8575 SuitePRO Digital Fan Coil Thermostats, Installation Instructions," 20 pages, Oct. 2013.

https://nest.com/support/pro/article/Help-with-Installation-and-set-up, "Nest Learning Thermostat Advanced Installation and Setup Help for Professional Installers," 22 pages, printed Feb. 20, 2016.

https://www.google.com/search?q=nest+sub+base&espv=2&biw=1032&bih=946&source=lnms&tbm=isch&sa=X&ved=0ahUKEwiNmea73YbLAhWJdR4KH . . . , "Thermostat Subbase—Google Search," 28 pages, printed Feb. 20, 2016.

https://www.google.com/search?q=nest+sub+base&espv=2&biw=1032&bih=946&source=lnms&tbm=isch&sa=X&ved=0ahUKEwiNmea73YbLAhWJdR4KH . . . , "Thermostat Wall Plate—Google Search," 16 pages, printed Feb. 20, 2016.

ICM Controls, "SC700V Non-Programmable Fan Coil Thermostat," 2 pages, downloaded Feb. 21, 2016.

Infineon, "TPM Key Backup and Recovery for Trusted Platforms," pp. 1-17, Sep. 21, 2006.

Lux, "WP567 LUX Universal Wallplate—Fits Thermostats TX500U, TX9100U, TX9600TS," available on Amazon.com, downloaded May 20, 2015.

Pro, "Heavy Duty Products for HVAC Professionals," 2 pages, downloaded Feb. 8, 2016.

Ritetemp, "Install Guide 6004," 7 pages, downloaded Feb. 21, 2016.

White-Rodgers, "F61-2XXX Adaptor Plate Assembly, Installation Instructions," 2 pages, downloaded Feb. 21, 2016.

Extended Search Report from counterpart European Application No. 17187535.4, dated Jan. 23, 2018, 6 pp.

Response to Extended Search Report dated Jan. 23, 2018, from counterpart European Application No. 17187535.4, filed May 23, 2018, 14 pp.

\* cited by examiner

HVAC CONTROLLER WITH A TEMPERATURE SENSOR MOUNTED ON A FLEX CIRCUIT

PRIORITY

This application claims the benefit of U.S. Provisional Application Ser. No. 62/380,219, filed Aug. 26, 2016, the entirety of which is incorporated herein by reference.

TECHNICAL FIELD

The present disclosure pertains to Heating, Ventilation, and/or Air Conditioning (HVAC) systems. More particularly, the present disclosure pertains to HVAC controllers, such as thermostats.

BACKGROUND

Heating, Ventilation, and/or Air Conditioning (HVAC) systems are often used to control the comfort level within a building or other structure. Such HVAC systems typically include an HVAC controller that controls various HVAC components of the HVAC system in order to affect and/or control one or more environmental conditions within the building. In many cases, the HVAC controller is mounted to an internal wall of the building and provides control signals to various HVAC components of the HVAC system, sometimes via a number of control wires that extend through the wall. Improvements in the hardware, user experience, and functionality of such HVAC controllers would be desirable.

SUMMARY

The present disclosure pertains generally to an HVAC controller with a temperature sensor. In some cases, the HVAC controller may be a thermostat. An HVAC controller may include a housing, a display, a printed wiring board, a flextail, and a temperature sensor such as a thermistor. The housing of the HVAC controller may be configured to house the display, the printed wiring board, the flextail, and the temperature sensor. The flextail may be a flexible circuit, a ribbon cable or any other suitable fixable circuit. The flextail may extend from, for example, the display or other component of the HVAC controller, along the interior surface of the housing, and connect to a connector on the printed wiring board. The temperature sensor may be mounted on the flextail and connected to the printed circuit board via the flex tail or other connection. In some cases, the temperature sensor may be positioned on the flextail such that when the flextail is connected to the printed wiring board, the temperature sensor is positioned adjacent a lower part of the housing, where less internal heat generated by the internal electrical components of the HVAC controller will reside.

The preceding summary is provided to facilitate an understanding of some of the features of the present disclosure and is not intended to be a full description. A full appreciation of the disclosure can be gained by taking the entire specification, claims, drawings, and abstract as a whole.

BRIEF DESCRIPTION OF THE DRAWINGS

The disclosure may be more completely understood in consideration of the following description of various illustrative embodiments of the disclosure in connection with the accompanying drawings, in which.

Figure 1:
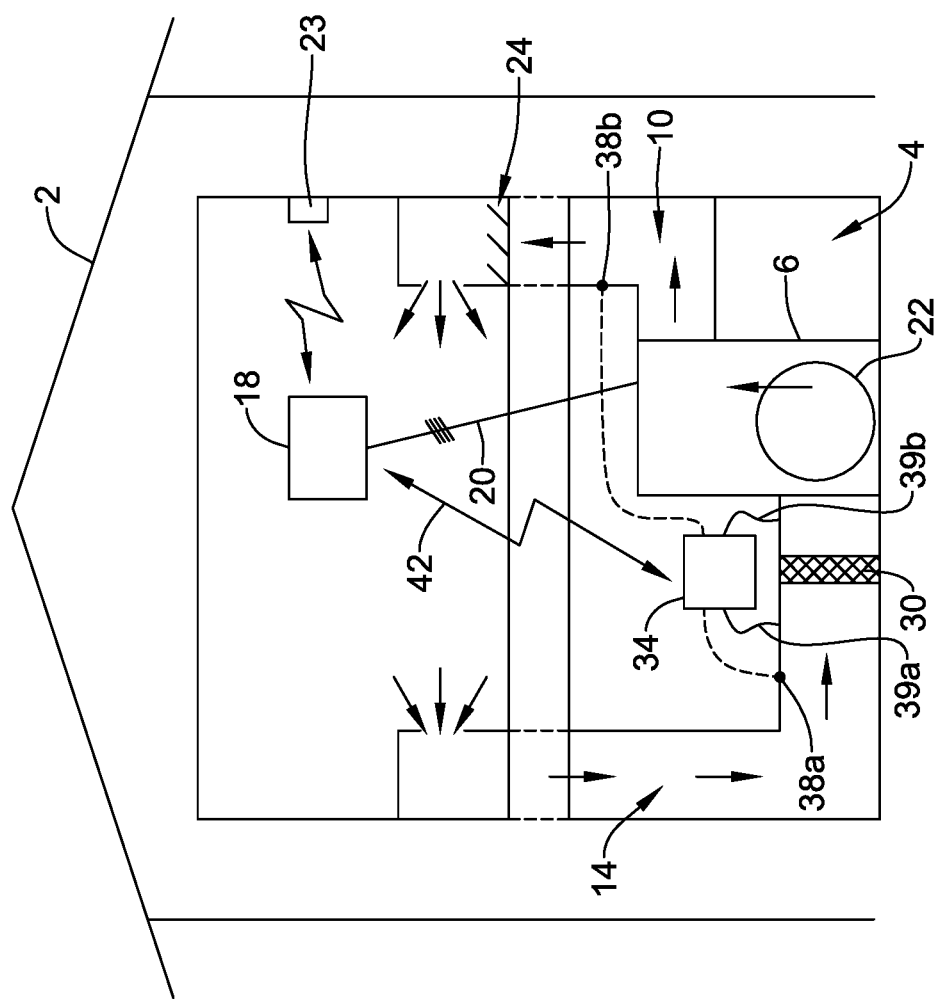
FIG. 1 is a schematic view of an illustrative HVAC system servicing a building or structure.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DESCRIPTION

The following description should be read with reference to the drawings wherein like reference numerals indicate like elements. The drawings, which are not necessarily to scale, are not intended to limit the scope of the disclosure. In some of the figures, elements not believed necessary to an understanding of relationships among illustrated components may have been omitted for clarity.

All numbers are herein assumed to be modified by the term "about", unless the content clearly dictates otherwise. The recitation of numerical ranges by endpoints includes all numbers subsumed within that range (e.g., 1 to 5 includes 1, 1.5, 2, 2.75, 3, 3.80, 4, and 5).

As used in this specification and the appended claims, the singular forms "a", "an", and "the" include the plural referents unless the content clearly dictates otherwise. As used in this specification and the appended claims, the term "or" is generally employed in its sense including "and/or" unless the content clearly dictates otherwise.

It is noted that references in the specification to "an embodiment", "some embodiments", "other embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is contemplated that the feature, structure, or characteristic may be applied to other embodiments whether or not explicitly described unless clearly stated to the contrary.

The present disclosure is directed generally at building automation systems. Building automation systems are systems that control one or more operations of a building. Building automation systems can include HVAC systems, security systems, fire suppression systems, energy management systems and other systems. While HVAC systems with HVAC controllers are used as an example below, it should be recognized that the concepts disclosed herein can be applied to building automation systems more generally.

FIG. 1 is a schematic view of a building 2 having an illustrative heating, ventilation, and air conditioning (HVAC) system 4. While FIG. 1 shows a typical forced air type HVAC system, other types of HVAC systems are contemplated including, but not limited to, boiler systems, radiant heating systems, electric heating systems, cooling systems, heat pump systems, and/or any other suitable type of HVAC system, as desired. The illustrative HVAC system 4 of FIG. 1 includes one or more HVAC components 6, a system of ductwork and air vents including a supply air duct 10 and a return air duct 14, and one or more HVAC controllers 18. The one or more HVAC components 6 may include, but are not limited to, a furnace, a heat pump, an electric heat pump, a geothermal heat pump, an electric heating unit, an air conditioning unit, a humidifier, a dehumidifier, an air exchanger, an air cleaner, a damper, a valve, and/or the like.

It is contemplated that the HVAC controller(s) 18 may be configured to control the comfort level in the building or structure by activating and deactivating the HVAC component(s) 6 in a controlled manner. The HVAC controller(s) 18 may be configured to control the HVAC component(s) 6 via a wired or wireless communication link 20. In some cases, the HVAC controller(s) 18 may be a thermostat, such as, for example, a wall mountable thermostat, but this is not required in all embodiments. Such a thermostat may include (e.g. within the thermostat housing or elsewhere) or have access to one or more temperature sensor(s) (e.g., one or more thermistors or other temperature sensors) for sensing ambient temperature at or near the thermostat. In some instances, the HVAC controller(s) 18 may be a zone controller, or may include multiple zone controllers each monitoring and/or controlling the comfort level within a particular zone in the building or other structure.

In the illustrative HVAC system 4 shown in FIG. 1, the HVAC component(s) 6 may provide heated air (and/or cooled air) via the ductwork throughout the building 2. As illustrated, the HVAC component(s) 6 may be in fluid communication with every room and/or zone in the building 2 via the ductwork 10 and 14, but this is not required. In operation, when a heat call signal is provided by the HVAC controller(s) 18, an HVAC component 6 (e.g. forced warm air furnace) may be activated to supply heated air to one or more rooms and/or zones within the building 2 via supply air ducts 10. The heated air may be forced through supply air duct 10 by a blower or fan 22. In this example, the cooler air from each zone may be returned to the HVAC component 6 (e.g. forced warm air furnace) for heating via return air ducts 14. Similarly, when a cool call signal is provided by the HVAC controller(s) 18, an HVAC component 6 (e.g. air conditioning unit) may be activated to supply cooled air to one or more rooms and/or zones within the building or other structure via supply air ducts 10. The cooled air may be forced through supply air duct 10 by the blower or fan 22. In this example, the warmer air from each zone may be returned to the HVAC component 6 (e.g. air conditioning unit) for cooling via return air ducts 14. In some cases, the HVAC system 4 may include an internet gateway or other device 23 that may allow one or more of the HVAC components 6, as described herein, to communicate over a wide area network (WAN) such as, for example, the Internet.

In some cases, the system of vents or ductwork 10 and/or 14 may include one or more dampers 24 to regulate the flow of air, but this is not required. For example, one or more dampers 24 may be coupled to one or more HVAC controller(s) 18, and can be coordinated with the operation of one or more HVAC components 6. The one or more HVAC controller(s) 18 may actuate dampers 24 to an open position, a closed position, and/or a partially open position to modulate the flow of air from the one or more HVAC components to an appropriate room and/or zone in the building or other structure. The dampers 24 may be particularly useful in zoned HVAC systems, and may be used to control which zone(s) receives conditioned air from the HVAC component(s) 6.

In many instances, one or more air filters 30 may be used to remove dust and other pollutants from the air inside the building 2. In the illustrative example shown in FIG. 1, the air filter(s) 30 is installed in the return air duct 14, and may filter the air prior to the air entering the HVAC component 6, but it is contemplated that any other suitable location for the air filter(s) 30 may be used. The presence of the air filter(s) 30 may not only improve the indoor air quality, but may also protect the HVAC components 6 from dust and other particulate matter that would otherwise be permitted to enter the HVAC component 6.

In some cases, and as shown in FIG. 1, the illustrative HVAC system 4 may include an equipment interface module (EIM) 34. When provided, the equipment interface module 34 may, in addition to controlling the HVAC under the direction of the thermostat, be configured to measure or detect a change in a given parameter between the return air side and the discharge air side of the HVAC system 4. For example, the equipment interface module 34 may measure a difference in temperature, flow rate, pressure, or a combination of any one of these parameters between the return air side and the discharge air side of the HVAC system 4. In some cases, the equipment interface module 34 may be adapted to measure the difference or change in temperature (delta T) between a return air side and discharge air side of the HVAC system 4 for the heating and/or cooling mode. The delta T for the heating and cooling modes may be calculated by subtracting the return air temperature from the discharge air temperature (e.g. delta T=discharge air temperature−return air temperature)

In some cases, the equipment interface module 34 may include a first temperature sensor 38a located in the return (incoming) air duct 14, and a second temperature sensor 38b located in the discharge (outgoing or supply) air duct 10. Alternatively, or in addition, the equipment interface module 34 may include a differential pressure sensor including a first pressure tap 39a located in the return (incoming) air duct 14, and a second pressure tap 39b located downstream of the air filter 30 to measure a change in a parameter related to the amount of flow restriction through the air filter 30. In some cases, the equipment interface module 34, when provided, may include at least one flow sensor that is capable of providing a measure that is related to the amount of air flow restriction through the air filter 30. In some cases, the equipment interface module 34 may include an air filter monitor. These are just some examples.

When provided, the equipment interface module 34 may be configured to communicate with the HVAC controller 18 via, for example, a wired or wireless communication link 42. In other cases, the equipment interface module 34 may be incorporated or combined with the HVAC controller 18. In some instances, the equipment interface module 34 may communicate, relay or otherwise transmit data regarding the selected parameter (e.g. temperature, pressure, flow rate, etc.) to the HVAC controller 18. In some cases, the HVAC controller 18 may use the data from the equipment interface module 34 to evaluate the system's operation and/or performance. For example, the HVAC controller 18 may compare data related to the difference in temperature (delta T) between the return air side and the discharge air side of the HVAC system 4 to a previously determined delta T limit stored in the HVAC controller 18 to determine a current operating performance of the HVAC system 4.

Figure 2:
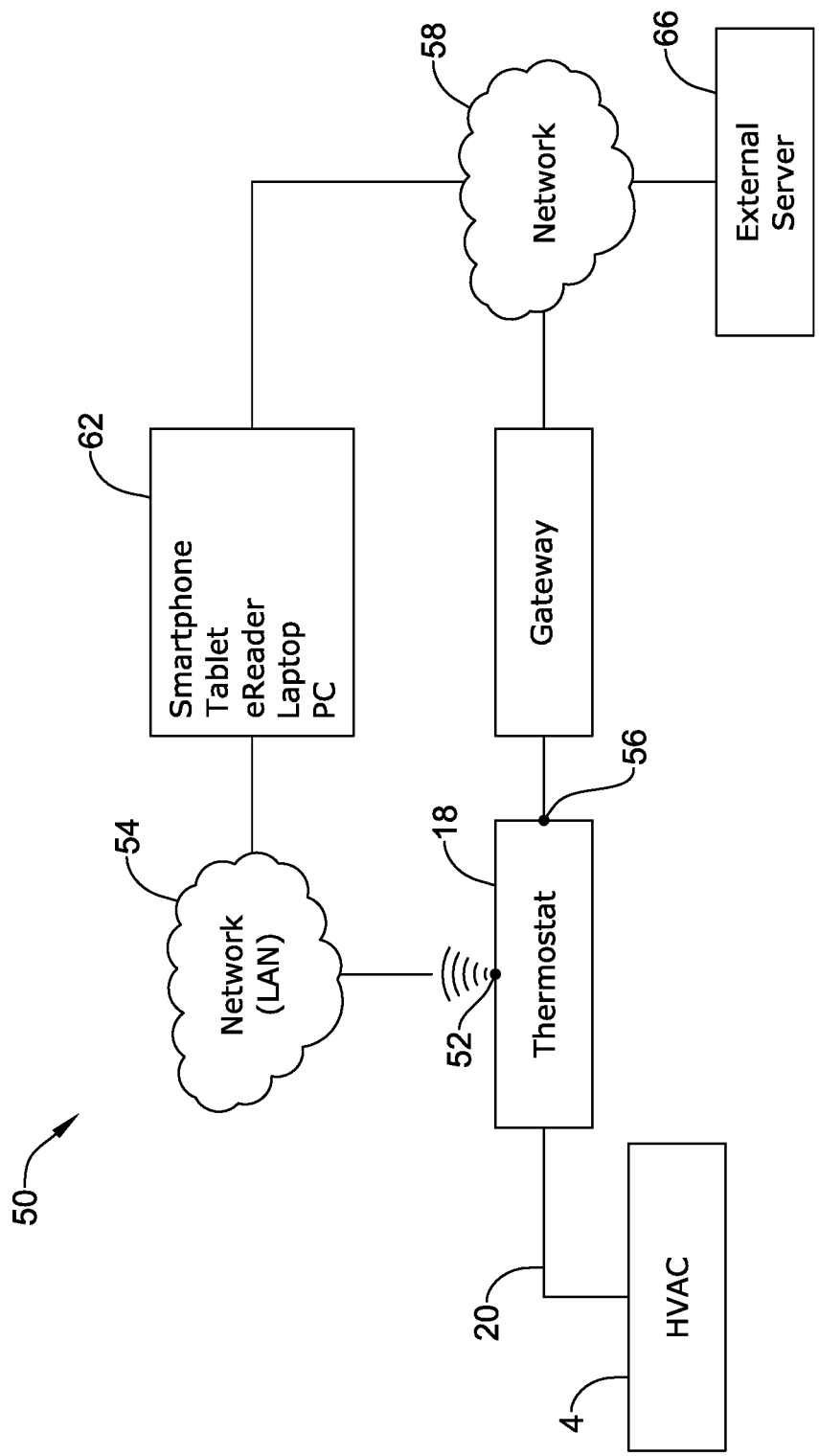
FIG. 2 is a schematic view of an illustrative HVAC control system that may facilitate access and/or control of the HVAC system of FIG. 1.

FIG. 2 is a schematic view of an illustrative HVAC control system 50 that facilitates remote access and/or control of the illustrative HVAC system 4 shown in FIG. 1. The HVAC control system 50 may be considered a building automation system or part of a building automation system. The illustrative HVAC control system 50 includes an HVAC controller, as for example, HVAC controller 18 (see FIG. 1) that is configured to communicate with and control one or more HVAC components 6 of the HVAC system 4. As discussed above, the HVAC controller 18 may communicate with the one or more HVAC components 6 of the HVAC system 4 via a wired or wireless link 20. Additionally, the HVAC controller 18 may communicate over one or more wired or wireless networks that may accommodate remote access and/or control of the HVAC controller 18 via another device such as a smart phone, tablet, e-reader, laptop computer, personal computer, key fob, or the like. As shown in FIG. 2, the HVAC controller 18 may include a first communications port 52 for communicating over a first network 54, and in some cases, a second communications port 56 for communicating over a second network 58. In some cases, the first network 54 may be a wireless local area network (LAN), and the second network 58 (when provided) may be a wide area network or global network (WAN) including, for example, the Internet. In some cases, the wireless local area network 54 may provide a wireless access point and/or a network host device that is separate from the HVAC controller 18. In other cases, the wireless local area network 54 may provide a wireless access point and/or a network host device that is part of the HVAC controller 18. In some cases, the wireless local area network 54 may include a local domain name server (DNS), but this is not required for all embodiments. In some cases, the wireless local area network 54 may be an ad-hoc wireless network, but this is not required.

In some cases, the HVAC controller 18 may be programmed to communicate over the second network 58 with an external web service hosted by one or more external web server(s) 66. A non-limiting example of such an external web service is Honeywell's TOTAL CONNECT™ web service. The HVAC controller 18 may be configured to upload selected data via the second network 58 to the external web service where it may be collected and stored on the external web server 66. In some cases, the data may be indicative of the performance of the HVAC system 4. Additionally, the HVAC controller 18 may be configured to receive and/or download selected data, settings and/or services sometimes including software updates from the external web service over the second network 58. The data, settings and/or services may be received automatically from the web service, downloaded periodically in accordance with a control algorithm, and/or downloaded in response to a user request. In some cases, for example, the HVAC controller 18 may be configured to receive and/or download an HVAC operating schedule and operating parameter settings such as, for example, temperature set points, humidity set points, start times, end times, schedules, window frost protection settings, and/or the like from the web server 66 over the second network 58. In some instances, the HVAC controller 18 may be configured to receive one or more user profiles having at least one operational parameter setting that is selected by and reflective of a user's preferences. In still other instances, the HVAC controller 18 may be configured to receive and/or download firmware and/or hardware updates such as, for example, device drivers from the web server 66 over the second network 58. Additionally, the HVAC controller 18 may be configured to receive local weather data, weather alerts and/or warnings, major stock index ticker data, traffic data, and/or news headlines over the second network 58. These are just some examples.

Depending upon the application and/or where the HVAC user is located, remote access and/or control of the HVAC controller 18 may be provided over the first network 54 and/or the second network 58. A variety of remote wireless devices 62 may be used to access and/or control the HVAC controller 18 from a remote location (e.g. remote from the HVAC Controller 18) over the first network 54 and/or second network 58 including, but not limited to, mobile phones including smart phones, tablet computers, laptop or personal computers, wireless network-enabled key fobs, e-readers, and/or the like. In many cases, the remote wireless devices 62 are configured to communicate wirelessly over the first network 54 and/or second network 58 with the HVAC controller 18 via one or more wireless communication protocols including, but not limited to, cellular communication, ZigBee, REDLINK™, Bluetooth, WiFi, IrDA, dedicated short range communication (DSRC), EnOcean, and/or any other suitable common or proprietary wireless protocol, as desired.

In some cases, an application program code (i.e. app) stored in the memory of the remote device 62 may be used to remotely access and/or control the HVAC controller 18, but this is not required. The application program code (app) may be downloaded from an external web service, such as the web service hosted by the external web server 66 (e.g. Honeywell's TOTAL CONNECT™ web service) or another external web service (e.g. ITUNES® or Google Play). In some cases, the app may provide a remote user interface for interacting with the HVAC controller 18 at the user's remote device 62. For example, through the user interface provided by the app, a user may be able to change operating parameter settings such as, for example, temperature set points, humidity set points, start times, end times, schedules, window frost protection settings, accept software updates and/or the like. Communications may be routed from the user's remote device 62 to the web server 66 and then, from the web server 66 to the HVAC controller 18. In some cases, communications may flow in the opposite direction such as, for example, when a user interacts directly with the HVAC controller 18 to change an operating parameter setting such as, for example, a schedule change or a set point change. The change made at the HVAC controller 18 may be routed to the web server 66 and then from the web server 66 to the remote device 62 where it may reflected by the application program executed by the remote device 62.

In some cases, a user may be able to interact with the HVAC controller 18 via a user interface provided by one or more web pages served up by the web server 66. The user may interact with the one or more web pages using a variety of internet capable devices to effect a setting or other change at the HVAC controller 18, and in some cases view usage data and energy consumption data related to the usage of the HVAC system 4. In some cases, communication may occur between the user's remote device 62 and the HVAC controller 18 without being relayed through a server such as external server 66. These are just some examples.

Figure 3:
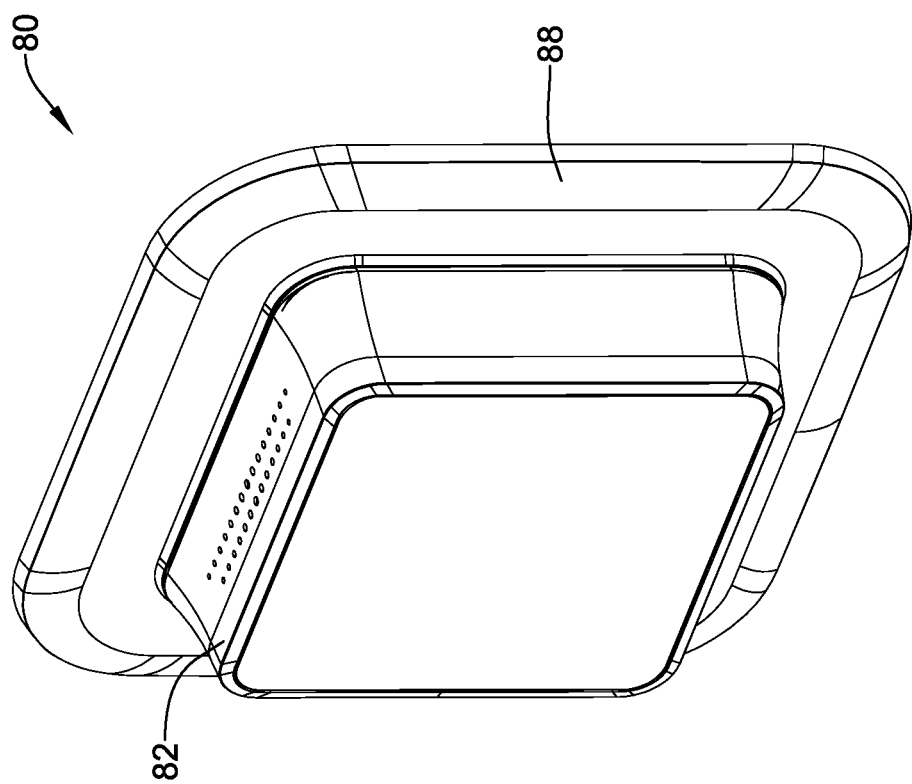
FIG. 3 is a schematic perspective view of an illustrative thermostat assembly that may be used in the HVAC control system of FIG. 2.
Figure 4:
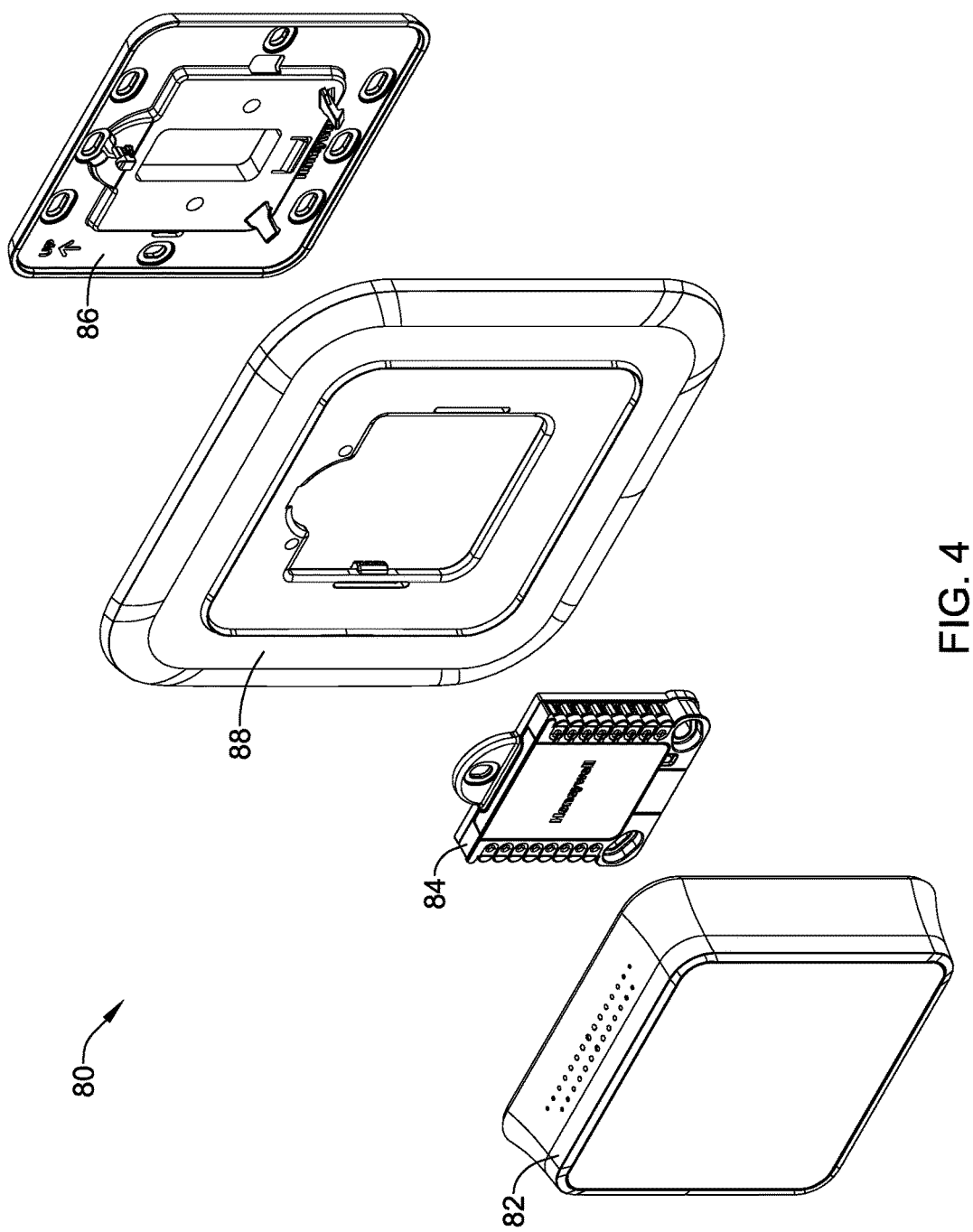
FIG. 4 is a schematic exploded perspective view of the illustrative thermostat assembly of FIG. 3.

FIG. 3 is a perspective view of an illustrative thermostat assembly 80, and FIG. 4 is an exploded perspective view of the illustrative thermostat assembly 80 of FIG. 3. In some instances, the thermostat assembly 80 may be considered as an example of the HVAC controller 18 referenced in FIGS. 1 and 2. In some instances, and with particular reference to FIG. 4, the thermostat assembly 80 may include a thermostat 82 and a wall mountable connector 84. The wall mountable connector 84 may be configured to accommodate field wires that enter from a rear of the wall mountable connector 84. When so provided, the wall mountable connector 84 may provide an electrical connection between terminals of the thermostat 82 and field wires (not illustrated) of the HVAC system 4 (FIGS. 1 and 2).

In the example shown, the wall mountable connector 84 may also provide a mechanical connection to the thermostat 82 and thus may be used to secure the thermostat 82 in place relative to a vertical surface such as a wall. The wall mountable connector 84 may be considered as being a fully integrated connector, providing electrical and mechanical connections to the thermostat 82 in a compact design that is small enough to be used with a variety of different thermostats and yet affords the ability to easily connect a plurality of field wires to the wall mountable connector 84.

In some instances, the wall mountable connector 84 itself may be secured to an adapter plate 86 that is configured to be secured to an electrical junction box or the like (not illustrated) disposed within the wall. In some cases, the adapter plate 86 may not be used, particularly if the field wires simply exit the wall through a hole in the wall. In some cases, an installer may utilize the adapter plate 86 if there is a large hole in the wall through which the field wires exit, even if there is no junction box within the wall.

In some cases, a wall covering plate 88 may be included to provide an aesthetically pleasing appearance to the thermostat assembly 80. In some instances, for example, the wall covering plate 88 may be larger than the thermostat 82 and may hide blemishes left on the wall from previous thermostat installations. In some cases, a homeowner may, for example, decide they want to install a wall covering plate 88 that has a different shape or design, or perhaps is a different color to match the color of a new thermostat.

Figure 5:
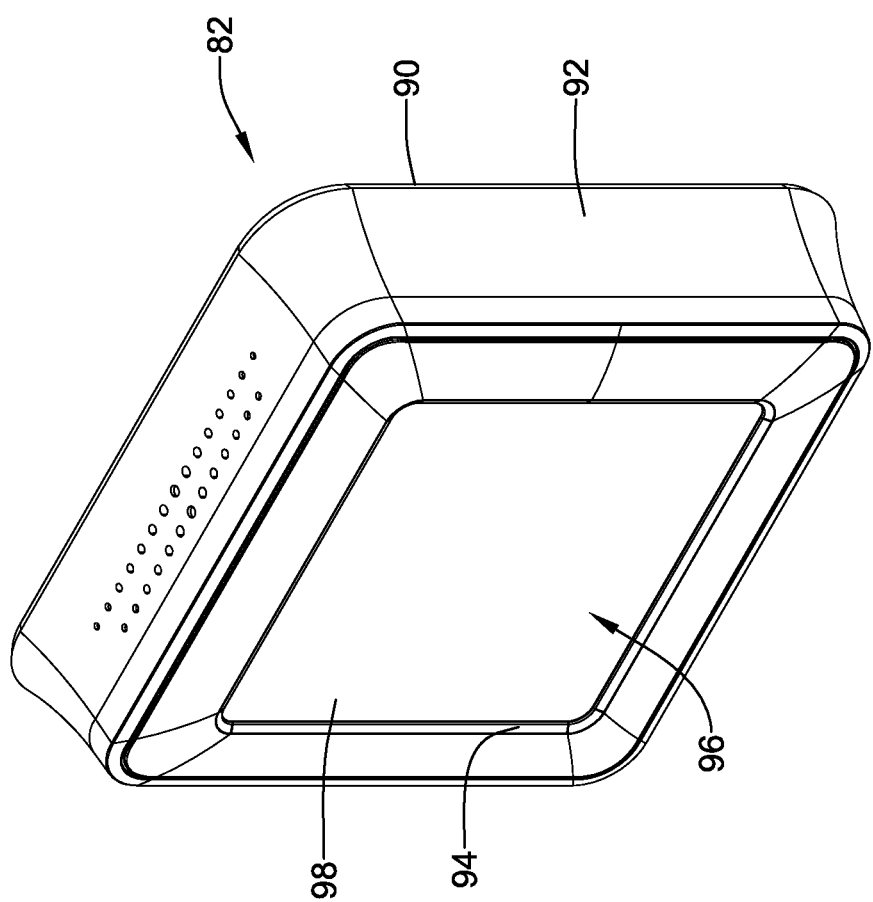
FIG. 5 is a schematic front perspective view of an illustrative thermostat.

FIG. 5 is a front perspective view of the thermostat 82. The thermostat 82 may have a housing 90 having a front cover 92 and a back cover 93 (not shown in FIG. 5). The front cover 92 may define an opening 94 through which a display 96 may be viewed and through which a user may interact with a touch screen 98.

Figure 6:
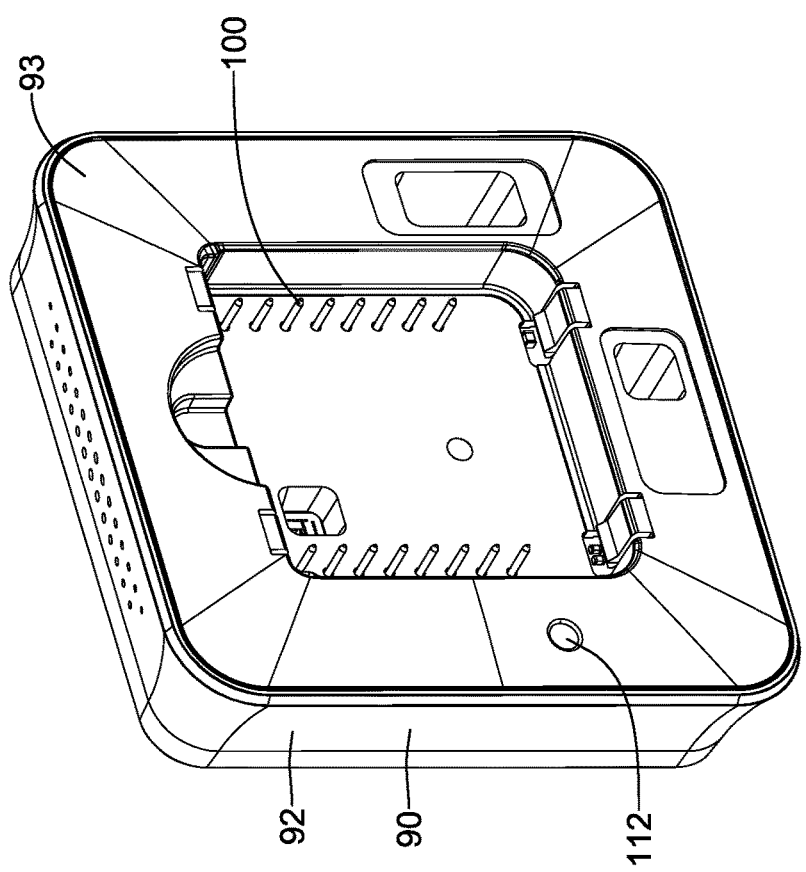
FIG. 6 is a schematic back perspective view of the illustrative thermostat of FIG. 5.

FIG. 6 is a back perspective view of the thermostat 82. As seen in FIG. 6, the front cover 92 may engage the back cover 93 to form the housing 90 of the thermostat. In some instances, one or more pins 100 may extending through the back cover 93 to engage the wall mountable connector 84. As discussed below, the front cover 92 and the back cover 93 may be configured to reduce or prevent gaps along where edges of the front cover 92 meet edges of the back cover 93.

Figure 7:
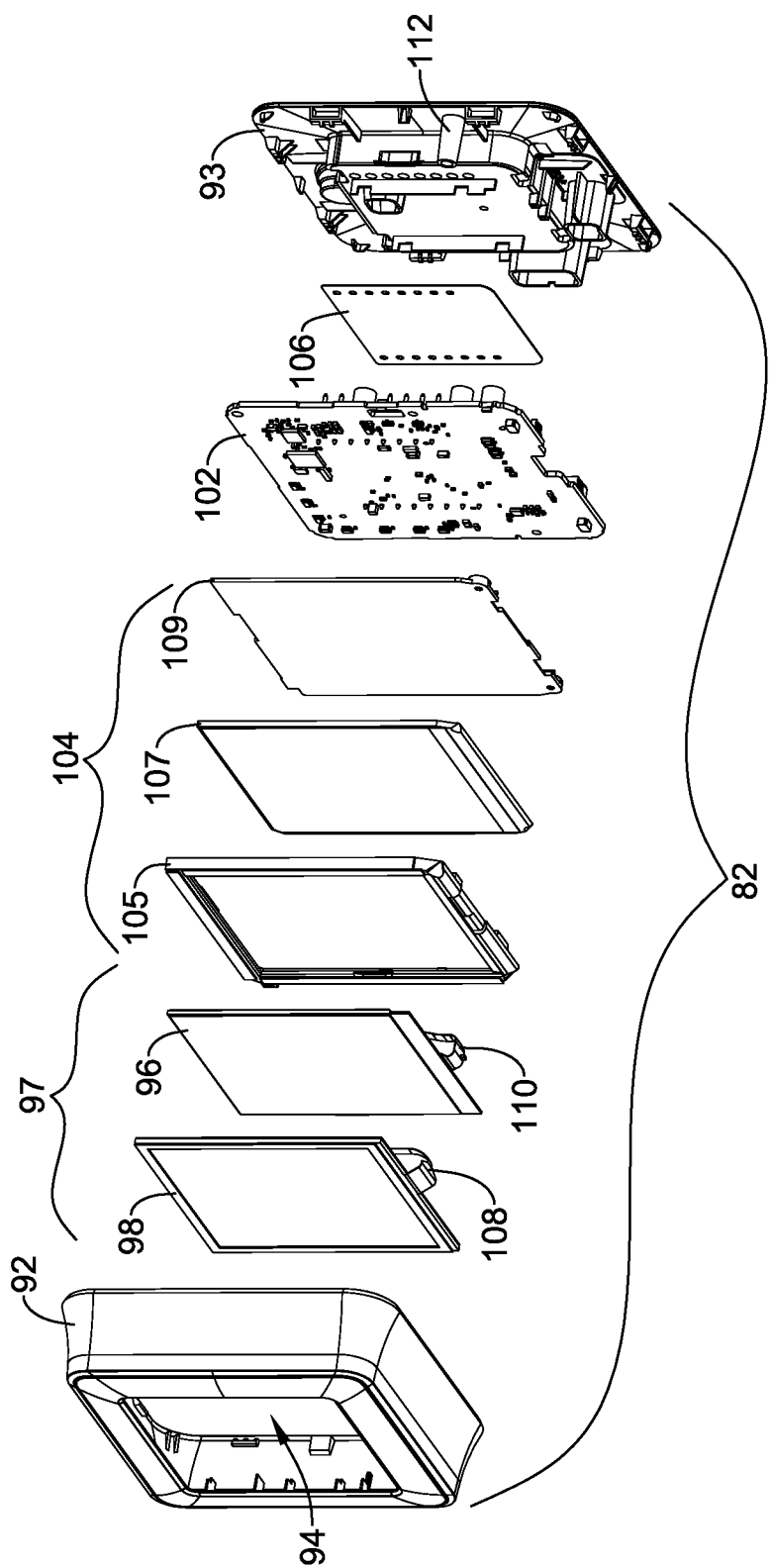
FIG. 7 is a schematic exploded front perspective view of the illustrative thermostat of FIG. 5.
Figure 8:
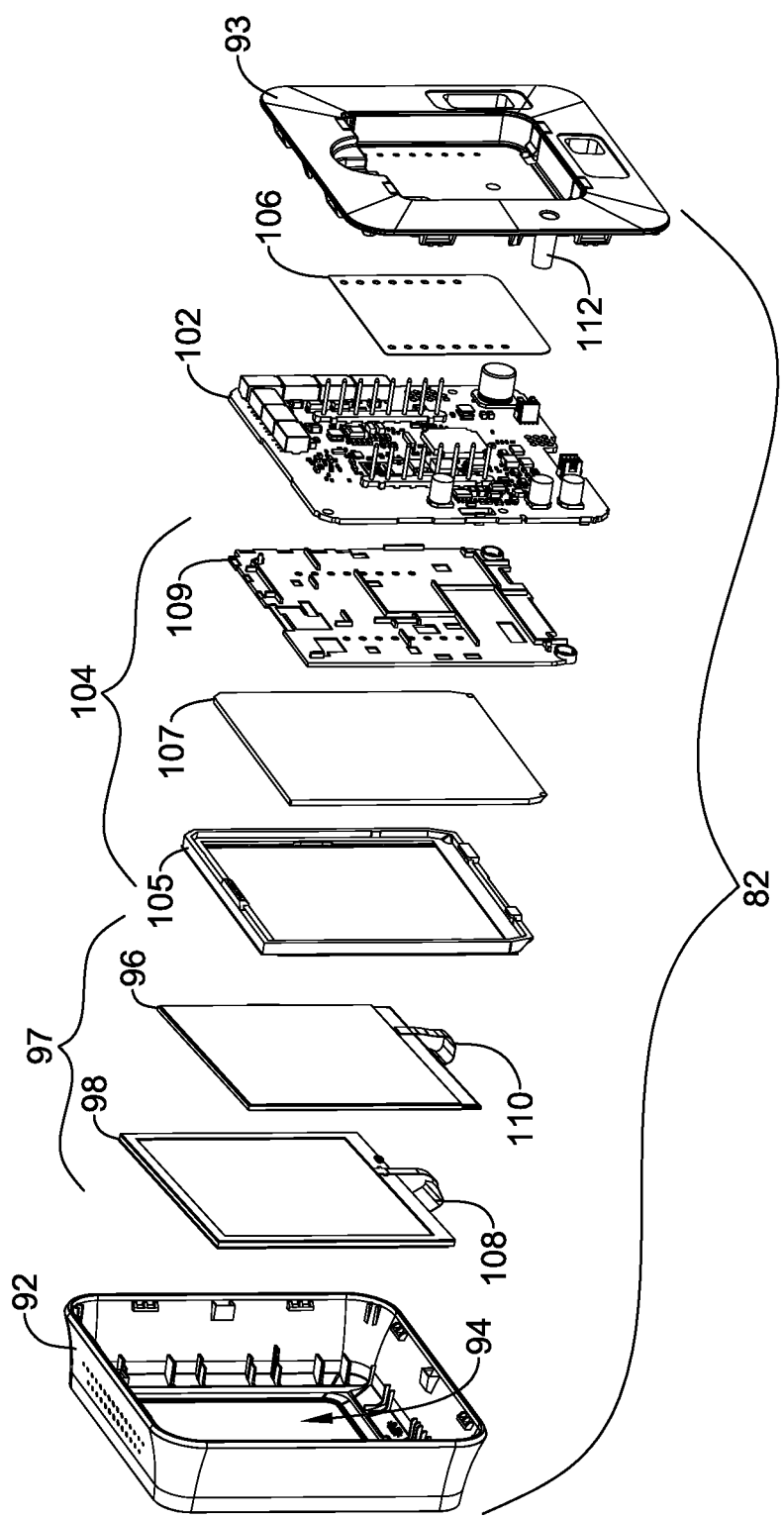
FIG. 8 is a schematic exploded back perspective view of the illustrative thermostat of FIG. 5.

FIGS. 7 and 8 are front and back, respectively, exploded perspective views of the thermostat 82. The thermostat 82 may contain one or more electrical and/or non-electrical components that may interact with one another to form a robust thermostat. In the example seen in FIGS. 7 and 8, the thermostat 82 may include a front cover 92 defining opening 94, a touch screen 98 having a screen flextail 108, a display 96 having a display flextail 110, a back light reflector and display spacer assembly 104, control circuitry at least partially implemented by a printed wiring board (PWB) 102, a PWB spacer 106, and the back cover 93.

The display 96 and the touch screen 98 (e.g., an indium tin oxide (ITO) touch screen or other type of touch screen) may work together to form an interface assembly 97 (e.g., a display assembly). A user may interact with interface assembly 97 in any manner, including, but not limited to, touching the touch screen 98, through interacting with a remote device (not shown), and/or through one or more other interaction mechanisms.

In some instances, the interface assembly 97 may include a 2-dimensional array of pixels that covers the full display area of the display 96. In some instances, the interface assembly 97 may include a display 96 that is a segmented display, which may include a plurality of predefined segments that can be switched on and off to give the appearance of desired characters, icons or other graphical features. In a segmented display, the predefined segments may not be arranged in a full 2-dimensional array of pixels that covers the full display area of the display 96. Rather, at least some of the predefined segments may be elongated, define a symbol or icon, or otherwise do not fall into a simple 2-dimensional array of pixels.

It is contemplated that the display 96 may be any suitable display panel using any suitable display panel technology. For example, the display 96 may include the following types of display panels: Eidophor, Electroluminescent display (ELD), Electronic paper (E Ink, Gyricon), Light emitting diode display (LED), Cathode ray tube (CRT) (Monoscope), Liquid-crystal display (LCD) (TFT, LED, Blue Phase, IPS), Plasma display panel (PDP) (ALiS), Digital Light Processing (DLP), Liquid crystal on silicon (LCoS), Organic light-emitting diode (OLED) (AMOLED), Organic light-emitting transistor (OLET), Surface-conduction electron-emitter display (SED), Field emission display (FED), Laser TV (Quantum dot, Liquid crystal), MEMS display (IMoD, TMOS, DMS), Quantum dot display (QD-LED), Ferro liquid display (FLD), Thick-film dielectric electroluminescent technology (TDEL), Telescopic pixel display (TPD), Laser Phosphor Display (LPD), or other type of display panel.

The back light reflector and display spacer assembly 104 may comprise a frame 105, a backlight guide plate 107, a spacer 109 and/or one or more other components. The components of the back light reflector and display spacer assembly 104 may be made from any material. In one example, the components of the back light reflector and display spacer assembly 104 may be made from plastic, but this is not required. As seen in FIG. 7, the printed wiring board 102 may include one or more lights sources (e.g., light emitting diodes (LEDs) or other light sources) and the back light reflector and display spacer assembly 104 may receive light from the light sources and deflect the light in a manner that may provide uniform or substantially uniform backlighting for the display 96.

In some cases, the back light reflector and display spacer assembly 104 may act as a spacer or space filler between the interface assembly 97 (e.g., the touch screen 98 and/or the display 96) and the PWB 102. In such situations and/or others, the back light reflector and display spacer assembly 104 may receive the touch screen 98 and/or display 96 at a side facing the front cover 92. When the back light reflector and display spacer assembly 104 and the touch screen 98 and/or display 96 received therein are inserted into the front cover 92, the back light reflector and display spacer assembly 104 may help ensure the touch screen 98 and/or display 96 are properly aligned with respect to the opening 94 of the front cover 92.

As seen in FIGS. 7 and 8, the back cover 93 may have a tunnel 112. The tunnel 112 may facilitate locating a pin leading to the PWB 102. The tunnel 112 may be utilized at any time, but in one example, the tunnel 112 may be used during programming and/or testing and may facilitate correct positioning of the PWB 102 against a testing fixture having electrical contacts.

During assembly of the thermostat 82, the various component parts may be assembled in a variety of ways. However, to ensure proper alignment of the various components of the thermostat 82, one example order may include inserting the touch screen 98, the display 96, and the back light reflector and display spacer assembly 104 into the front cover 92. When inserted in the front cover 92, the touch screen 98, the display 96, and/or the back light reflector and display spacer assembly 104 may be entirely or at least partially surrounded by ribs (e.g., rib features 120 described below with respect to FIG. 9) of the front cover 92, where the ribs may act with the back light reflector and display spacer assembly 104 to align the touch screen 98 and/or the display 96 with the opening 94. The PWB 102 and PWB spacer 106 may then be placed over the back light reflector and display spacer assembly 104 and against the ribs of the front cover 92, where a front side of the PWB 102 may be facing a back side of the back light reflector and display spacer assembly 104. The ribs of the front cover 92 may interact with the slots and/or other features of the PWB 102 to properly position the PWB 102 within the front cover 92. Then, the back cover 93 may be placed over the PWB 102 and the PWB spacer 106. The back cover 93 may push against the back side of the PWB at one or more locations and may lock the components of the thermostat 82 in their respective positions within the housing 90. In some cases, the back cover 93 may latch or otherwise engage the front cover 92, as discussed further below.

Figure 9:
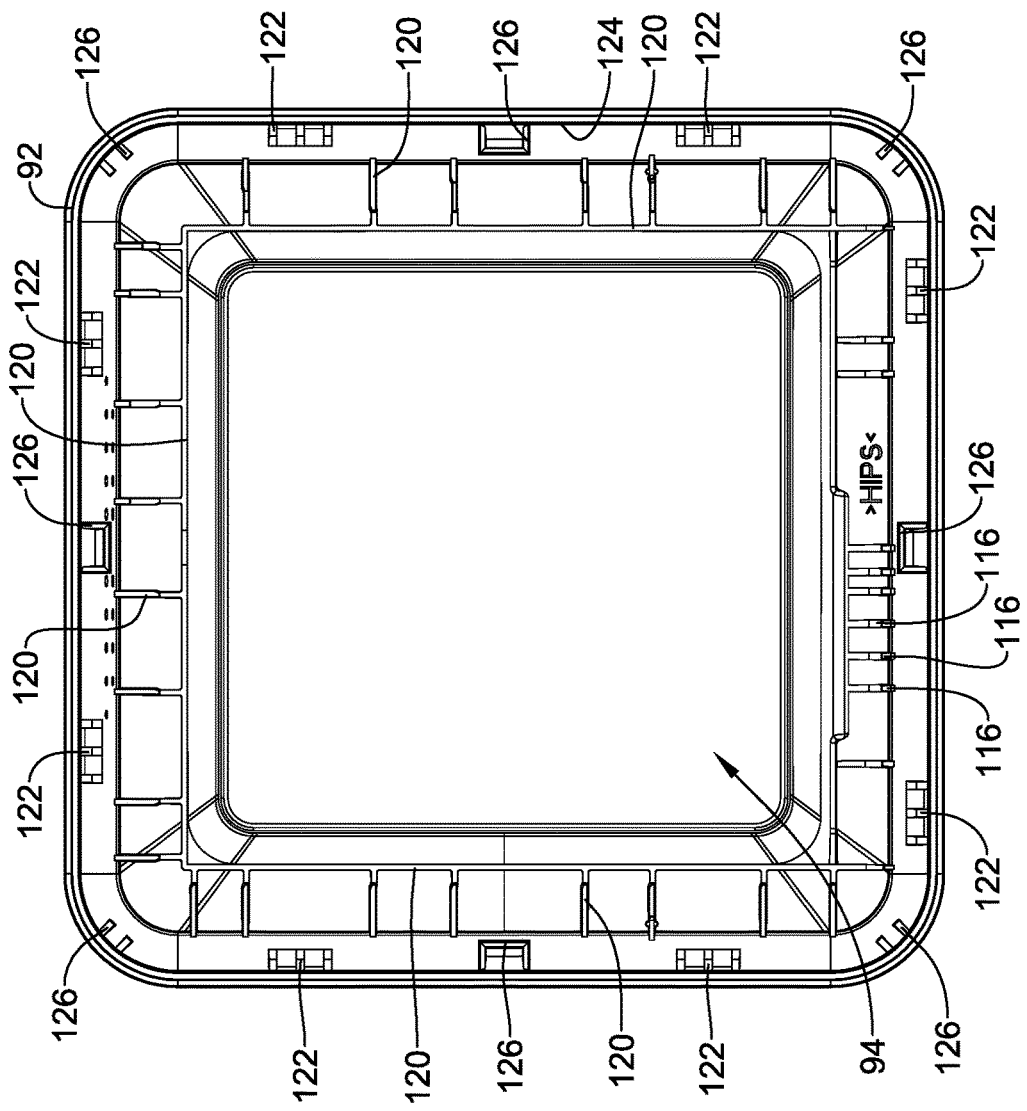
FIG. 9 is a schematic interior-side view of an illustrative front cover of a thermostat.

The housing 90 may have an interior side and an exterior side, where one or more electrical components may be enclosed within the housing 90 on the interior side. FIG. 9 is a view of an interior side of the front cover 92. The front cover 92 may include one or more rib features 120 configured to engage and/or otherwise align components of the thermostat 82 within the front cover 92 and the back cover 93. For clarity purposes, only some of the depicted rib features 120 are labeled.

The front cover 92 may include one or more latches 122. The latches 122 may be configured to engage latch receivers 132 (discussed with respect to FIGS. 10 and 12 below) as the front cover 92 and the back cover 93 come into contact with one another. The latches 122 and the latch receivers 132 may releasably secure the front cover 92 to the back cover 93. In some instances, the latches 122 may extend inward from an inner edge 124 of the front cover 92.

There may be any number of latches 122 on the front cover 92. In some instances, there may be one (1) latch, two (2) latches, three (3) latches, four (4) latches, six (6) latches, eight (8) latches or other number of latches 122.

The latches 122 may be equally spaced around a perimeter (e.g., the edge 124 or other perimeter) of the front cover 92. Alternatively, one or more of the latches 122 may be irregularly spaced around the perimeter of the front cover 92. As shown in the example depicted in FIG. 9, the front cover 92 may include eight (8) latches 122. The eight (8) latches of FIG. 9 include four pairs of latches, with each pair of latches servicing one side of the front cover 92.

The front cover 92 may include one or more first guide features 126. The first guide features 126 may be configured to engage associated second guide features 134 (discussed further with respect to FIGS. 10 and 13 below) prior to the latches 122 fully interacting with associated latch receivers 132 as the front cover 92 and the back cover 93 are brought together.

The first guide features 126 may be configured to receive and/or engage second guide features 134 as the front cover 92 and the back cover 93 come into contact with one another. In some instances, one or more of the first guide features 126 may be configured to be received within an associated second guide features 134, but this is not required.

Figure 13:
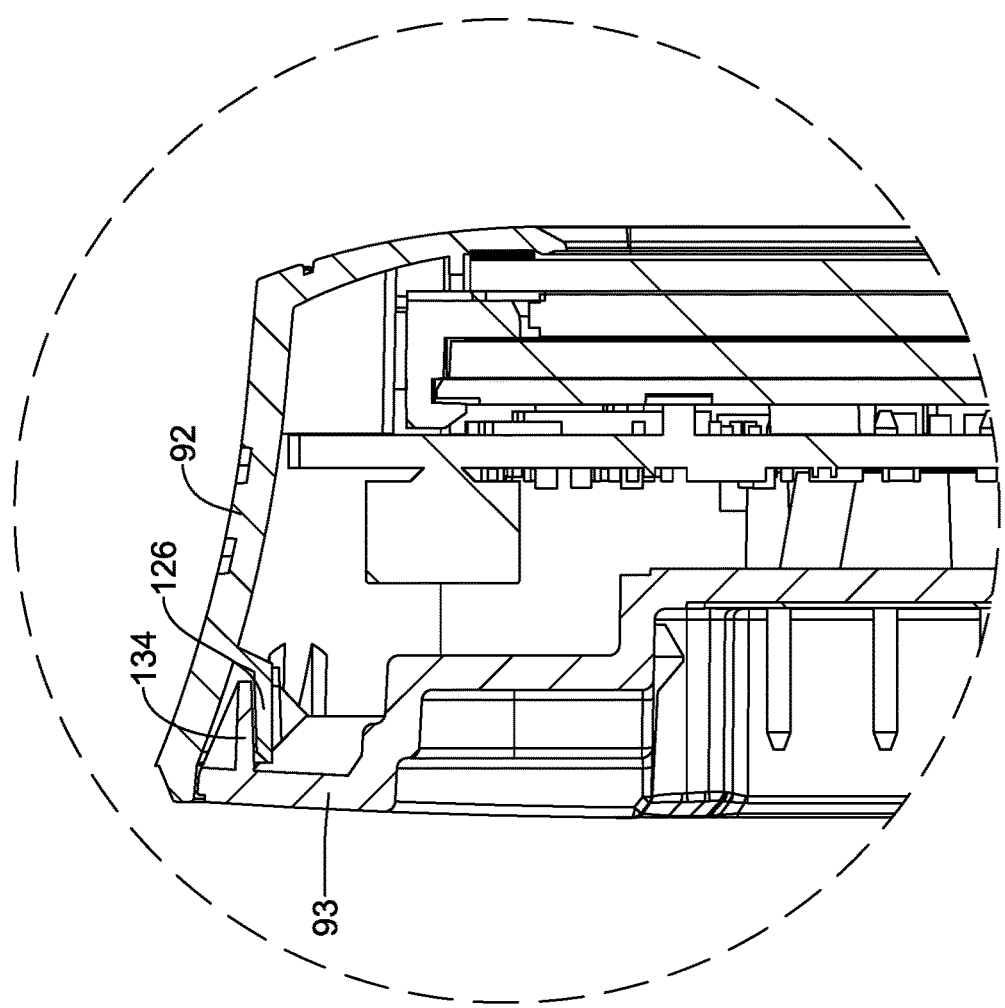
FIG. 13 is a cross-sectional view showing an illustrative first guide feature engaging an illustrative second guide feature.

In one example of the first guide features 126, the first guide features 126 may extend from an interior surface of the front cover 92 and form an encircled opening for receiving a second guide features 134, as best shown in FIG. 13. In some cases, the first guide features 126 may be a dome, a pin, or have a different configuration.

The front cover 92 may include any number of first guide features 126. In some instances, there may be one (1), two (2), three (3), four (4), six (6), eight (8) first guide features 126 or other number of first guide features 126. As shown in FIG. 9, a first guide feature 126 may be located midway between each pair of latches 122. In some cases, a first guide feature 126 may be located in each corner as well. In some cases, the first guide features 126 located in the corners of the interior side of the front cover 92 may take a different form than the first guide features 126 along the side edges of the interior side of the front cover 92.

When the housing is fully assembled, the first guide features 126 and the second guide features 134 (discussed below) may facilitate maintaining a desired shape of the housing 90 by providing support between latches to reduce or prevent gaps from forming along locations where edges of the front cover 92 meet edges of the back cover 93. In some cases, without the guide features, permanent gaps may form if the housing sidewalls become deformed as a result of the latches fully engaging the latch receivers.

Figure 10:
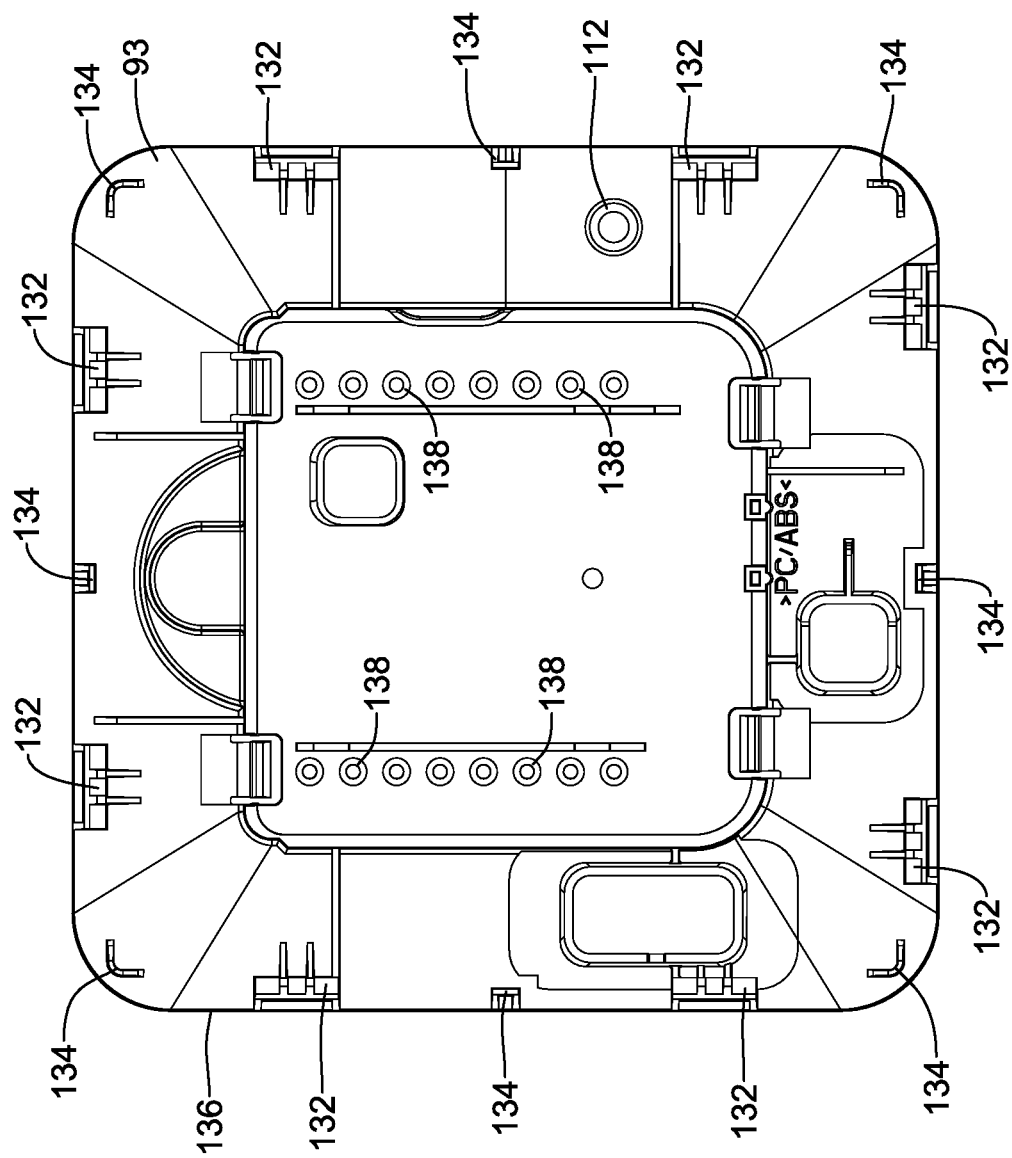
FIG. 10 is a schematic interior-side view of an illustrative back cover of a thermostat.
Figure 11:
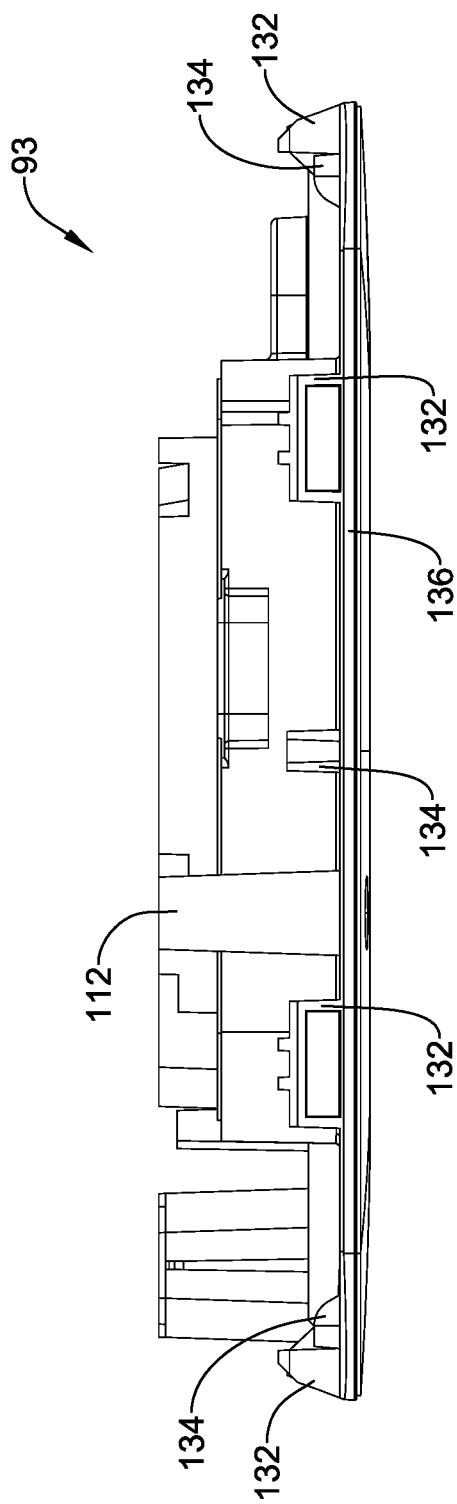
FIG. 11 is a schematic side view of the illustrative back cover of FIG. 10.

FIG. 10 is a view of an interior side of the back cover 93 and FIG. 11 is a side view of the back cover 93 of FIG. 10. In the example shown, the back cover 93 may include one or more latch receivers 132, pin holes 138 (for clarity purposes, only some pin holes 138 are labeled) configured to receive pins extending from the PWB 102, and/or other features.

Figure 12:
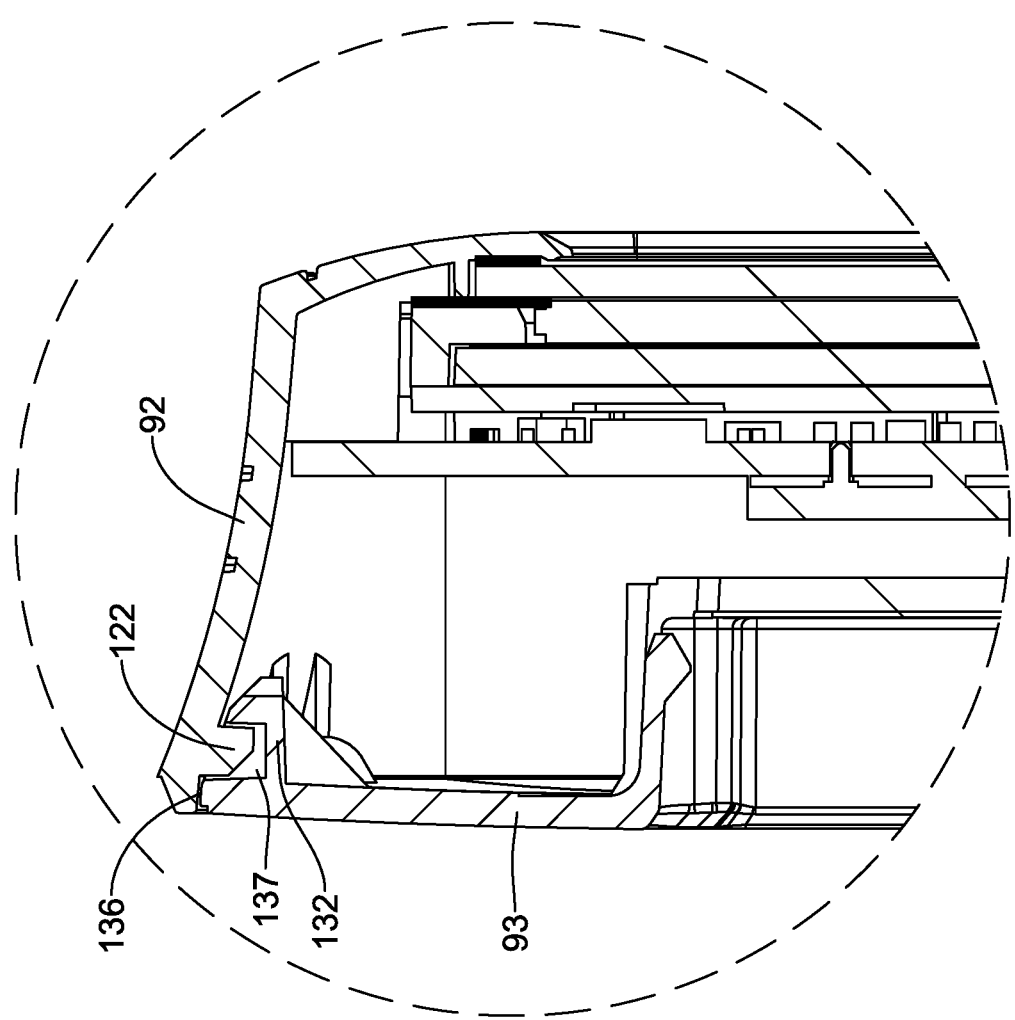
FIG. 12 is a cross-sectional view showing an illustrative latch latched with an illustrative latch receiver.

The latch receivers 132 may be configured to engage latches 122 (discussed above with respect to FIG. 9) as the front cover 92 and the back cover 93 come into contact with one another. The latch receivers 132 and the latches 122 may releasably secure the front cover 92 to the back cover 93. In some instances, and as best shown in FIG. 12, the latch receivers 132 may form a latch slot 137 extending inward from a side edge 136 of the back cover 93, and may bend the latches 122, and the sidewall of the front cover 92, outward until the latches 122 snap into the latch slot 137. FIG. 12 is a cross-sectional view showing a latch 122 fully latched with a latch receiver 132.

In some cases, the second guide features 134 help to prevent the first guide features 126, and thus the sidewall of the front cover 92, from also bending outward, as best shown in FIG. 13, thereby limiting or preventing the sidewalls of the front cover 92 from becoming permanently deformed. FIG. 13 is a cross-sectional view showing a first guide feature 126 engaging a second guide feature 134. In some cases, without the guide features 126 and 134, permanent gaps may form if the sidewalls of the front cover 92 become deformed as a result of the latches 122 fully engaging the latch receivers 132.

There may be any number of latch receivers 132 on the back cover 93. In some instances, there may be one (1) latch receiver, two (2) latch receivers, three (3) latch receivers, four (4) latch receivers, six (6) latch receivers, eight (8) latch receivers, or other number of latch receiver 132. In one example, there may be the same number of latch receivers 132 as there are latches 122. As shown in FIG. 10, the back cover 93 may include eight (8) latch receivers 132 and the latch receivers 132 may be aligned with the latches 122 of the front cover 92.

As shown, the back cover 93 may include one or more second guide features 134. The second guide features 134 may be configured to be inserted into and/or engage the first guide features 126 (discussed above with respect to FIGS. 9 and 13) as the front cover 92 and the back cover 93 come into contact with one another. Additionally or alternatively, each of one or more of the second guide features 134 may be configured to receive a corresponding first guide feature 126.

In some cases, the second guide features 134 may engage associated first guide features 126 prior to the latches 122 fully interacting with associated latch receivers 132 as the front cover 92 and the back cover 93 are brought together. In one example of the second guide features 134, the second guide features 134 may extend from an interior surface of the back cover 93 and may be configured to be received within an encircled opening of the first guide features 126, as best shown in FIGS. 9-11 and 13. However, it is contemplated that the second guide feature 134 may take on one or more other shapes and/or may be configured to receive the first guide features 126 therein. As discussed above, the guide features may help prevent the sidewall of the front cover 92 from bowing out when the latches 122 interact with associated latch receivers 132.

The back cover 93 may include any number of second guide features 134. In some instances, there may be one (1), two (2), three (3), four (4), six (6), eight (8) second guide features 134 or other number of second guide features 134. As shown in FIG. 10, the back cover 93 may include a second guide feature 134 adjacent the perimeter of the back cover 93 such that each side edge of the back cover 93 has a second guide feature 134 equally spaced between two latch receivers 132.

In some cases, each corner of the interior side of the back cover 93 may include a second guide feature 134 that may or may not take on a similar form as the second guide features 134 that may be positioned along the side edges of the interior side of the back cover 93. In one example, as shown in FIG. 10, the second guide features 134 located in the corners of the interior side of the back cover 93 may take a different form than the second guide features 134 along the side edges of the interior side of the back cover 93 and may form a corner for receiving the first guide features 126 in the corners on the interior side of the front cover 92.

When the first guide features 126 and the second guide features 134 are omitted from the housing 90, a gap may form between edge 124 of the front cover 92 and edge 136 of the back cover 93. The gap may form for any of a number of reasons. In one example, the gap may form due to a configuration of the latches 122 (e.g., a configuration configured to prevent ghosting artefacts on walls of the front cover 92), bending or stretching of the wall of the front cover 92 or back cover as the latches 122 engage the latch receivers 132, a thickness of the walls of the housing 90, a material of the housing 90, and/or the gap may form for other reasons. In some cases, the gap may be permanent without the first and second guide features.

The first guide features 126 and the second guide features 134 may be positioned to help prevent or mitigate formation of gaps between the front cover 92 and the back cover 93. The combination of latching mechanisms (e.g., the latches 122 and the latch receivers 132) with guide features (e.g., the first guide features 126 and the second guide features 134) may result in a good stiff connection between parts, while maintaining a gap free interface even when the sidewalls of the front cover 92 are fairly thin.

Figure 14:
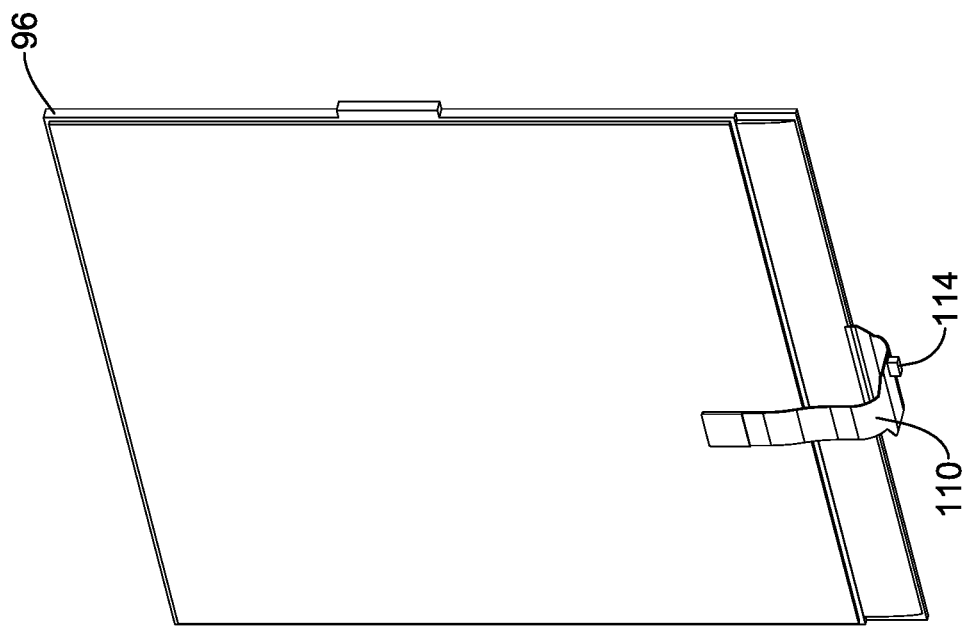
FIG. 14 is a schematic perspective view of an illustrative display of a thermostat.

FIG. 14 is a perspective view of the display 96 with the display flextail 110 (e.g., a flexible circuit). In one example, the display flextail 110 may be configured to extend from a bottom of the display 96, extend around the back light reflector and display spacer assembly 104, and connect to a back side of the PWB 102, where the PWB 102 has a front side facing the back light reflector and display spacer assembly 104 and a back side facing an opposite direction. When the display flextail 110 is connected to the PWB 102, the display 96 may be electrically connected to the PWB 102. The flextail 110 may be a flexible circuit, a ribbon cable, or any other suitable flexible circuit.

As shown in FIG. 14, the display flextail 110 may include a temperature sensor 114, such as a thermistor. The thermistor 114 may be attached to the flextail 110 in any manner including, but not limited to, by soldering or other connection technique. The thermistor 114 may be the only thermistor 114 utilized by the thermostat 82 or one of two or more thermistors used by the thermostat 82 to sense and/or determine ambient temperature around the thermostat 82. In some cases, the thermistor 114 may be electrically connected to the PWB 102 through the display flextail 110, while in another cases the thermistor 114 may be electrically connected to the PWB 102 via a different connection mechanism.

As electronic components of the thermostat 82, such as the touch screen 98, the display 96, electrical components on the PWB 102, and/or other electrical components, may produce heat as those components operate, it has been found to be desirable to separate and/or isolate at least one thermistor of the thermostat from such heat producing components. In one instance, it may be desirable to place at least one thermistor at a location within the thermostat 82 (e.g., within housing 90) that may be less influenced by heat of electronic components operating therein.

Illustratively, ambient temperature around a thermostat may be determined by utilizing measurements from at least two thermistors, where one thermistor is considered a cold thermistor and another thermistor is considered a warmer thermistor. A warmer thermistor may be placed near electronic components producing heat and a cold thermistor may be spaced from the electronic components producing heat. A processor of a thermostat using at least two thermistors may take measurements from the warmer thermistor and the cold thermistor and determine an ambient temperature from a heat flow equation.

It has been determined, relative to other locations within the housing 90 of the thermostat 82, that adjacent a bottom of the interior surface of the front cover 92 is a location that may be minimally affected by heat exhausted from operating electronic components of the thermostat 82 and thus, may be considered an acceptable location to place a cold thermistor. This may be particularly so in the disclosed thermostat where the display 96 and/or the PWB 102 do not extend to a base of the interior surface of the housing 90 (e.g., front cover 92, as seen for example in FIG. 15).

To facilitate positioning a thermistor 114 adjacent the interior surface of the housing 90, the thermistor 114 may be placed on a flextail or other flexible circuit extending from the PWB 102, as such flextails may extend adjacent to and/or touch a bottom of the housing 90 that is spaced from the PWB 102 and/or other heat producing components of the thermostat 82. Although the thermistor 114 is discussed as being placed on the display flextail 110, the thermistor 114 may be placed on any flexible circuit including, but not limited to, the screen flextail 108, the display flextail 110, and its own flexible circuit.

Figure 15:
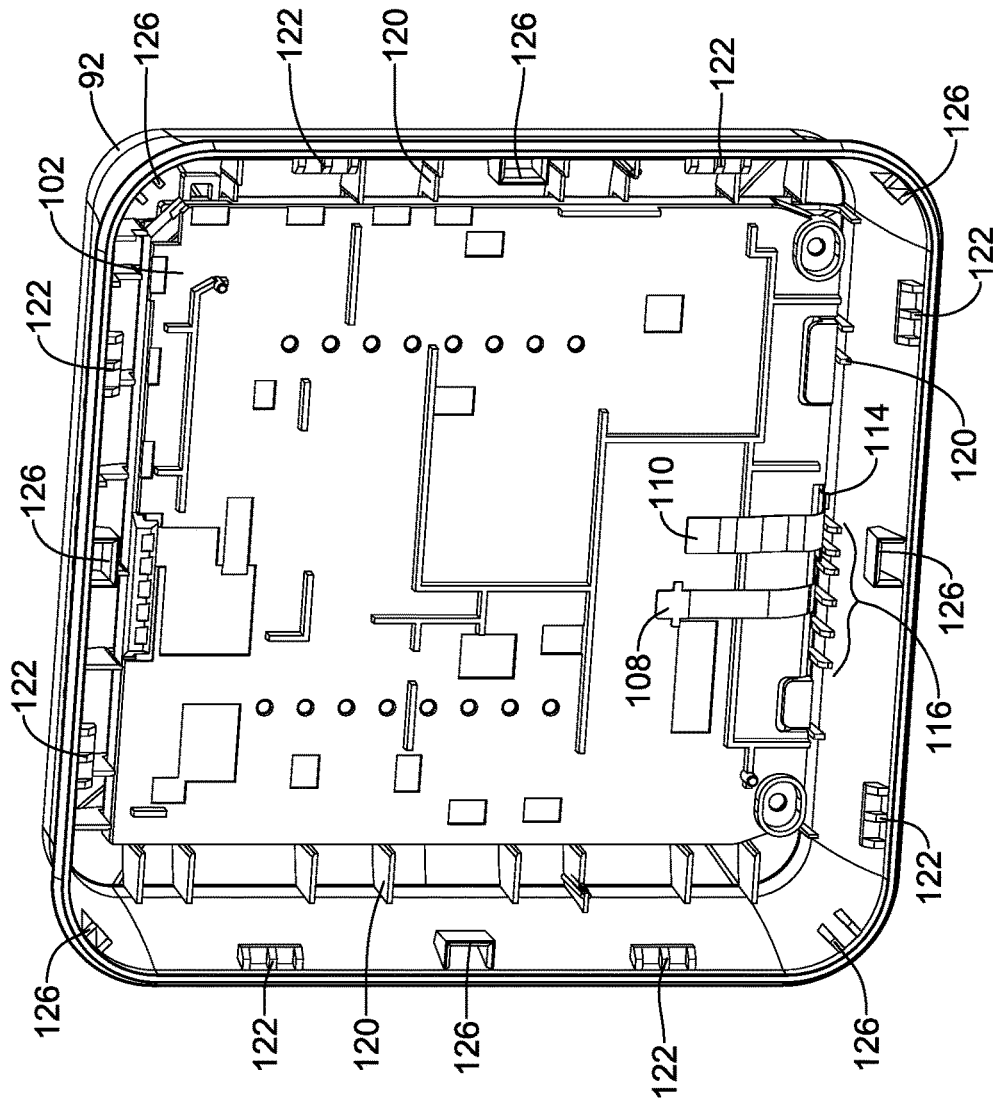
FIG. 15 is a schematic interior side view of illustrative components of a thermostat.

As shown in FIG. 15, the thermistor 114 may be mounted on the display flextail 110 at a location that abuts or is adjacent an interior surface of the front cover 92 below the display 96, the PWB 102, and the back light reflector and display spacer assembly 104. In one example, the thermistor may face the interior surface of the front cover 92 when the display flextail 110 is connected to the PWB 102. Further, utilization of the display flextail 110 may be advantageous during manufacturing because less material is required and one fewer component for connection to the PWB 102 may be needed.

To facilitate proper and repeatable placement of the thermistor 114, the front cover 92 may include one or more thermistor spacing ribs 116. The thermistor spacing ribs 116 of the front cover 92 may help ensure that the thermistor 114 is positioned at a same location and a same distance from the front cover 92 by contacting the display flextail 110 as it wraps around the PWB 102 to ensure proper bending and/or deformation of the display flextail. It may be desirable to ensure the thermistor 114 is consistently located within the housing 90 during manufacturing so that equations used to determine an ambient temperature around the thermostat accurately determine a temperature at the thermistor 114.

Although not shown, the thermistor 114 on the display flextail 110 may be isolated from electronic components producing heat by an additional material. Illustratively, a heat conducting material may be placed between the thermistor 114 and a wall of the housing 90. In one example, the heat conducting material may be a rubber and/or a foam based material. Such material may be in a paste or other form and may be applied to the front cover 92 with a pocket formed therein that may be configured to receive the thermistor 114.

Those skilled in the art will recognize that the present disclosure may be manifested in a variety of forms other than the specific embodiments described and contemplated herein. Accordingly, departure in form and detail may be made without departing from the scope and spirit of the present disclosure as described in the appended claims.

What is claimed is:

1. A thermostat, comprising:
   a display assembly;
   a printed wiring board;
   a back light reflector interposed between the display assembly and the printed wiring board;
   a flexible circuit extending from the display assembly to the printed wiring board; and
   a first temperature sensor placed on a surface of the flexible circuit and operatively coupled to the printed wiring board, wherein the flexible circuit extends around the back light reflector, and
   wherein the surface of the flexible circuit faces outwardly away from the back light reflector.

2. The thermostat of claim 1, further comprising a housing for housing the display assembly, the back light reflector, the printed wiring board, the flexible circuit, and the first temperature sensor.

3. The thermostat of claim 2, wherein the first temperature sensor contacts the surface of the flexible circuit and wherein the first temperature sensor is positioned adjacent an interior surface of the housing.

4. The thermostat of claim 2, wherein the first temperature sensor is adjacent a bottom side of the housing.

5. The thermostat of claim 2, further comprising a heat conductive material between the first temperature sensor and the housing.

6. The thermostat of claim 2, further comprising:
   a second temperature sensor spaced from the first temperature sensor; and
   a processor communicatively couple with the first temperature sensor and the second temperature sensor,
   wherein the processor is configured to determine an ambient temperature based on temperature data values transmitted from the first temperature sensor and the second temperature sensor.

7. The thermostat of claim 1, wherein the flexible circuit wraps around a bottom edge of the printed wiring board and a bottom edge of the back light reflector, and the first temperature sensor is mounted to a portion of the flexible circuit that wraps around the bottom edge of the printed wiring board and the bottom edge of the back light reflector.

8. The thermostat of claim 2, wherein an interior surface of the housing includes one or more ribsd that are configured to engage and align the flexible circuit within the housing.

9. An HVAC controller, comprising:
   control circuitry;
   a flexible circuit operatively coupled to the control circuitry;
   a temperature sensor secured to a first side of the flexible circuit;
   a display operatively coupled to the control circuitry; and
   a display spacer configured to receive the display, wherein the first side of the flexible circuit faces away from the display spacer.

10. The HVAC controller of claim 9, wherein:
    the flexible circuit has a first end portion connected to the display.

11. The HVAC controller of claim 10, wherein the flexible circuit comprisees a second end portion configured to provide a connection between the display and the control circuitry.

12. The HVAC controller of claim 9, further comprosing:
    a printed wiring board incorporating at least some of the control circuitry; and
    wherein the printed wiring board is configured to electrically connect to the display via the flexible circuit.

13. The HVAC controller of claim 12, wherein the display is positioned adjacent a first side of the printed wiring board and the flexible circuit connects to a second opposing side of the printed wiring board.

14. The HVAC controller of claim 12, wherein:
the temperature sensor extends from the first side and faces away from the printed wiring board and the display spacer, and
the flexible circuit has a second side that faces the printed wiring board and the display spacer.

15. A device comprising:
a flexible circuit;
a temperature sensor positioned along a temperature sensor portion of the flexible circuit;
a printed wiring board electrically connected to the flexible circuit;
a display assembly coupled to the printed wiring board;
a display spacer interposed between the display assemble and the printed wiring board, wherein the temperature sensor portion of the flexible circuit faces outwardly away from the display spacer; and
a housing at least partially housing the flexible cicruit, the temperature sensor, the display assembly the display spacer, and the printed wiring board.

16. The device of claim 15, wherein the temperature sensor is spaced from the printed wiring board and faces an interio surface of the housing.

17. The device of claim 15,
wherein the temperature sensor is configured to operatively couple with the printed wiring board via an end portion, and
wherein the temperature sensor portion of the flexible circuit is distinct from the end portion.

18. A temperature control apparatus comprising:
a user interface;
control circuitry communicatively coupled with the user interface via at least one data transmission line, the at least one data transmission line configured to extend outwardly away from the control circuitry; and
a temperature sensing device separate and distinct from the control circuitry, wherein the temperature sensing device is communicatively coupled with the control circuitry via the at least one data transmission line,
wherein the at least one data transmission line includes the at least one temperature sensing device positioned on the at least one data transmission line, and
wherein the temperature sensing device is oriented to face outwardly away from the control circuitry.

19. The temperature control apparatus of claim 18, wherein the temperature control apparatus comprises a thermostat configured to control a heating, ventilation, and/or air conditioning system.

20. The temperature control apparatus of claim 18, wherein the user interface comprises a backlit touchscreen.

21. The temperature control apparatus of claim 18, wherein the at least one data transmission line comprises at least one wire, the at least one data transmission line configured to communicate temperature data via the at least one wire.

22. The temperature control apparatus of claim 18, wherein the control circuitry comprises an electronic control board, and wherein the at least one data transmission line is configured to transmit temperature data values from the temperature sensing device to the electronic control board.

23. The temperature control apparatus of claim 18, further comprising communication circuitry, wherein the temperature control apparatus is configured to communicate temperature data wirelessly via the communication circuitry.

* * * * *

UNITED STATES PATENT AND TRADEMARK OFFICE
CERTIFICATE OF CORRECTION

PATENT NO. : 10,895,883 B2
APPLICATION NO. : 15/678000
DATED : January 19, 2021
INVENTOR(S) : Tomas Rezny et al.

It is certified that error appears in the above-identified patent and that said Letters Patent is hereby corrected as shown below:

In the Claims

Column 14, Line 40 (Claim 8): Replace "ribsd" with --ribs--

Column 14, Line 56 (Claim 11): Replace "comprisees" with --comprises--

Column 14, Line 59 (Claim 12): Replace "comprosing" with --comprising--

Signed and Sealed this
Nineteenth Day of April, 2022

*Katherine Kelly Vidal*

Katherine Kelly Vidal
*Director of the United States Patent and Trademark Office*